(12) United States Patent
Donofrio et al.

(10) Patent No.: US 9,166,126 B2
(45) Date of Patent: Oct. 20, 2015

(54) CONFORMALLY COATED LIGHT EMITTING DEVICES AND METHODS FOR PROVIDING THE SAME

(75) Inventors: Matthew Donofrio, Raleigh, NC (US); Howard Nordby, Pittsboro, NC (US); Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 329 days.

(21) Appl. No.: 13/017,845

(22) Filed: Jan. 31, 2011

(65) Prior Publication Data
US 2012/0193648 A1 Aug. 2, 2012

(51) Int. Cl.
| H01L 33/00 | (2010.01) |
| H01L 33/50 | (2010.01) |
| H01L 33/44 | (2010.01) |
| H01L 33/54 | (2010.01) |

(52) U.S. Cl.
CPC .............. *H01L 33/508* (2013.01); *H01L 33/44* (2013.01); *H01L 33/507* (2013.01); *H01L 33/54* (2013.01); *H01L 33/505* (2013.01)

(58) Field of Classification Search
CPC ..... H01L 33/54; H01L 33/507; H01L 33/505; H01L 33/44
USPC .......................................................... 257/98
See application file for complete search history.

(56) References Cited

U.S. PATENT DOCUMENTS

| 2,736,671 A | 2/1956 | Ransburg et al. |
| 4,415,123 A | 11/1983 | Ikeuchi |
| 4,576,796 A | 3/1986 | McCormick |
| 4,733,335 A | 3/1988 | Serizawa et al. .............. 362/503 |
| 4,918,497 A | 4/1990 | Edmond |
| 4,935,665 A | 6/1990 | Murata ......................... 313/500 |
| 4,946,547 A | 8/1990 | Palmour et al. ............... 156/643 |
| 4,966,862 A | 10/1990 | Edmond |
| 4,984,034 A | 1/1991 | Yamazaki ...................... 257/88 |
| 5,027,168 A | 6/1991 | Edmond |

(Continued)

FOREIGN PATENT DOCUMENTS

| CN | 2310925 | 3/1999 |
| CN | 1476050 | 2/2004 |

(Continued)

OTHER PUBLICATIONS

International Search Report and Written Opinion of the International Searching Authority, or the Declaration corresponding to International Application No. PCT/US 11/25794; Date of Mailing: May 9, 2011; 11 Pages.

(Continued)

*Primary Examiner* — Evan Pert
(74) *Attorney, Agent, or Firm* — Koppel, Patrick, Heybl & Philpott

(57) ABSTRACT

Methods are disclosed including applying a conformal coating to multiple light emitters. The conformal coating forms in gap areas between adjacent ones of the light emitters. The plurality of light emitters are separated into individual light emitters. The individual light emitters include the conformal coating that extends to a space corresponding to respective gap areas. Light emitting structures are disclosed including a semiconductor light emitting diode (LED) having an active region and a conformal coating including a first portion and a second portion, the first portion corresponding to at least one surface of the LED and the second portion extending from the first portion.

26 Claims, 14 Drawing Sheets

(56) References Cited

U.S. PATENT DOCUMENTS

| | | | |
|---|---|---|---|
| 5,200,022 A | 4/1993 | Kong et al. | 156/612 |
| 5,210,051 A | 5/1993 | Carter, Jr. | |
| 5,277,840 A | 1/1994 | Osaka et al. | 252/301.36 |
| 5,338,944 A | 8/1994 | Edmond et al. | |
| RE34,861 E | 2/1995 | Davis et al. | 437/100 |
| 5,393,993 A | 2/1995 | Edmond et al. | |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,614,131 A | 3/1997 | Mukerji et al. | 264/1.9 |
| 5,631,190 A | 5/1997 | Negley | 438/33 |
| 5,739,554 A | 4/1998 | Edmond et al. | 257/103 |
| 5,766,987 A | 6/1998 | Mitchell et al. | 438/126 |
| 5,813,753 A | 9/1998 | Vriens et al. | 362/293 |
| 5,849,354 A | 12/1998 | Tsuchiyama | 427/73 |
| 5,858,278 A | 1/1999 | Itoh et al. | 252/301.4 R |
| 5,912,477 A | 6/1999 | Negley | 257/95 |
| 5,923,053 A | 7/1999 | Jakowetz et al. | 257/95 |
| 5,959,316 A | 9/1999 | Lowery | |
| 5,998,925 A | 12/1999 | Shimizu et al. | 313/503 |
| 6,001,671 A | 12/1999 | Fjelstad | 438/112 |
| 6,066,861 A | 5/2000 | Hohn et al. | 257/99 |
| 6,069,440 A | 5/2000 | Shimizu et al. | 313/486 |
| 6,087,202 A | 7/2000 | Exposito et al. | 438/113 |
| 6,120,600 A | 9/2000 | Edmond et al. | 117/89 |
| 6,132,072 A | 10/2000 | Turnbull et al. | 362/494 |
| 6,139,304 A | 10/2000 | Centofante | 425/121 |
| 6,153,448 A | 11/2000 | Takahashi et al. | |
| 6,157,086 A | 12/2000 | Weber | 257/788 |
| 6,187,606 B1 | 2/2001 | Edmond et al. | 438/46 |
| 6,201,262 B1 | 3/2001 | Edmond et al. | 257/77 |
| 6,245,259 B1 | 6/2001 | Hohn et al. | 252/301.36 |
| 6,252,254 B1 | 6/2001 | Soules et al. | 257/89 |
| 6,257,737 B1 | 7/2001 | Marshall et al. | |
| 6,329,224 B1 | 12/2001 | Nguyen et al. | 438/127 |
| 6,331,063 B1 | 12/2001 | Kamada et al. | 362/237 |
| 6,333,522 B1 | 12/2001 | Inoue et al. | 257/99 |
| 6,338,813 B1 | 1/2002 | Hsu et al. | 264/272.14 |
| 6,366,018 B1 | 4/2002 | Garbuzov et al. | |
| 6,376,277 B2 | 4/2002 | Corisis | 438/106 |
| 6,404,125 B1 | 6/2002 | Garbuzov et al. | 313/499 |
| 6,410,942 B1 | 6/2002 | Thibeault et al. | 257/88 |
| 6,468,832 B1 | 10/2002 | Mostafazadeh | 438/112 |
| 6,531,328 B1 | 3/2003 | Chen | 438/26 |
| 6,576,488 B2 * | 6/2003 | Collins et al. | 438/29 |
| 6,583,444 B2 | 6/2003 | Fjelstad | 257/82 |
| 6,614,103 B1 | 9/2003 | Durocher et al. | 257/678 |
| 6,624,058 B1 | 9/2003 | Kazama | 438/612 |
| 6,635,263 B2 | 10/2003 | Tanida et al. | 424/401 |
| 6,642,652 B2 | 11/2003 | Collins, III et al. | 313/512 |
| 6,650,044 B1 | 11/2003 | Lowery | 313/502 |
| 6,653,765 B1 | 11/2003 | Levinson | 313/112 |
| 6,664,560 B2 | 12/2003 | Emerson et al. | |
| 6,686,676 B2 | 2/2004 | McNulty et al. | |
| 6,733,711 B2 | 5/2004 | Durocher et al. | 264/272.14 |
| 6,734,033 B2 | 5/2004 | Emerson et al. | |
| 6,759,266 B1 | 7/2004 | Hoffman | 438/64 |
| 6,759,723 B2 | 7/2004 | Silverbrook | 257/433 |
| 6,791,119 B2 | 9/2004 | Slater, Jr. et al. | 257/99 |
| 6,793,371 B2 | 9/2004 | Lamke et al. | 362/241 |
| 6,812,500 B2 | 11/2004 | Reeh et al. | 257/98 |
| 6,853,010 B2 | 2/2005 | Slater, Jr. et al. | 257/98 |
| 6,860,621 B2 | 3/2005 | Bachl et al. | 362/373 |
| 6,878,563 B2 | 4/2005 | Bader et al. | 438/22 |
| 6,891,200 B2 | 5/2005 | Nagai et al. | |
| 6,919,683 B1 | 7/2005 | Jang | 313/503 |
| 6,921,929 B2 | 7/2005 | LeBoeuf et al. | 257/100 |
| 6,924,233 B1 | 8/2005 | Chua et al. | |
| 6,924,596 B2 | 8/2005 | Sato et al. | |
| 6,936,862 B1 | 8/2005 | Chang et al. | |
| 6,958,497 B2 | 10/2005 | Emerson et al. | 257/94 |
| 6,960,878 B2 | 11/2005 | Sakano et al. | |
| 6,967,116 B2 | 11/2005 | Negley | |
| 7,023,019 B2 | 4/2006 | Madea et al. | 257/89 |
| 7,029,935 B2 | 4/2006 | Negley et al. | |
| 7,042,020 B2 | 5/2006 | Negley | |
| 7,049,159 B2 | 5/2006 | Lowery | 438/22 |
| 7,078,737 B2 | 7/2006 | Yuri | |
| 7,160,012 B2 | 1/2007 | Hilscher et al. | |
| 7,183,586 B2 | 2/2007 | Ichihara | |
| 7,183,587 B2 | 2/2007 | Negley et al. | 257/99 |
| 7,202,598 B2 | 4/2007 | Juestel et al. | 313/503 |
| 7,246,923 B2 | 7/2007 | Conner | |
| 7,259,402 B2 | 8/2007 | Edmond et al. | |
| 7,286,296 B2 | 10/2007 | Chaves et al. | 359/641 |
| 7,304,325 B2 * | 12/2007 | Uemura et al. | 257/79 |
| 7,326,583 B2 | 2/2008 | Andrews et al. | |
| 7,390,684 B2 | 6/2008 | Izuno et al. | |
| 7,442,564 B2 | 10/2008 | Andrews | |
| 7,521,728 B2 | 4/2009 | Andrews | |
| 7,566,639 B2 * | 7/2009 | Kohda | 438/463 |
| 7,646,035 B2 | 1/2010 | Loh et al. | |
| 7,816,705 B2 | 10/2010 | Lee et al. | 257/99 |
| 8,610,145 B2 | 12/2013 | Yano | 257/98 |
| 2001/0000622 A1 | 5/2001 | Reeh et al. | |
| 2001/0007484 A1 | 7/2001 | Sakamaki | 349/2 |
| 2001/0015442 A1 | 8/2001 | Kondoh et al. | 257/79 |
| 2001/0019177 A1 | 9/2001 | Sugihara | 257/780 |
| 2001/0038166 A1 | 11/2001 | Weber | 264/272 |
| 2002/0028527 A1 | 3/2002 | Maeda et al. | |
| 2002/0048905 A1 | 4/2002 | Ikegami et al. | 438/464 |
| 2002/0056847 A1 | 5/2002 | Uemura et al. | |
| 2002/0057057 A1 | 5/2002 | Sorg | |
| 2002/0063520 A1 | 5/2002 | Yu et al. | |
| 2002/0070449 A1 | 6/2002 | Yagi et al. | |
| 2002/0079837 A1 | 6/2002 | Okazaki | |
| 2002/0088985 A1 | 7/2002 | Komoto et al. | |
| 2002/0105266 A1 | 8/2002 | Juestel et al. | |
| 2002/0123164 A1 | 9/2002 | Slater, Jr. et al. | |
| 2002/0158578 A1 | 10/2002 | Eliashevich et al. | |
| 2002/0185965 A1 | 12/2002 | Collins, III et al. | |
| 2002/0195935 A1 | 12/2002 | Jaager et al. | |
| 2003/0006418 A1 | 1/2003 | Emerson et al. | |
| 2003/0079989 A1 | 5/2003 | Klocke et al. | |
| 2003/0089918 A1 | 5/2003 | Hiller et al. | |
| 2003/0160258 A1 | 8/2003 | Oohata | |
| 2003/0181122 A1 | 9/2003 | Collins et al. | 445/24 |
| 2004/0012958 A1 | 1/2004 | Hashimoto | |
| 2004/0041159 A1 | 3/2004 | Yuri et al. | |
| 2004/0041222 A1 | 3/2004 | Loh | |
| 2004/0056260 A1 | 3/2004 | Slater et al. | |
| 2004/0061433 A1 | 4/2004 | Izuno et al. | 313/498 |
| 2004/0104391 A1 | 6/2004 | Maeda et al. | |
| 2004/0124429 A1 | 7/2004 | Stokes | |
| 2004/0140765 A1 | 7/2004 | Takekuma et al. | |
| 2004/0164307 A1 | 8/2004 | Mueller-Mach et al. | |
| 2004/0164311 A1 | 8/2004 | Uemura | |
| 2004/0170018 A1 | 9/2004 | Nawashiro | |
| 2004/0173806 A1 | 9/2004 | Chua | |
| 2004/0180475 A1 | 9/2004 | Shibata et al. | 438/127 |
| 2004/0188697 A1 | 9/2004 | Brunner et al. | |
| 2004/0245530 A1 | 12/2004 | Kameyama et al. | |
| 2004/0256974 A1 | 12/2004 | Mueller-Mach et al. | |
| 2004/0263073 A1 | 12/2004 | Baroky et al. | 313/512 |
| 2005/0001225 A1 | 1/2005 | Yoshimura et al. | |
| 2005/0006651 A1 | 1/2005 | LeBoeuf et al. | |
| 2005/0051782 A1 | 3/2005 | Negley et al. | |
| 2005/0062140 A1 | 3/2005 | Leung et al. | |
| 2005/0072981 A1 | 4/2005 | Suenaga | |
| 2005/0080193 A1 | 4/2005 | Woulters et al. | 525/191 |
| 2005/0093004 A1 | 5/2005 | Yoo | |
| 2005/0145991 A1 | 7/2005 | Sakamoto et al. | |
| 2005/0161682 A1 | 7/2005 | Mazzochette et al. | |
| 2005/0167682 A1 | 8/2005 | Fukasawa | |
| 2005/0184305 A1 | 8/2005 | Ueda | |
| 2005/0184638 A1 | 8/2005 | Muller et al. | |
| 2005/0194606 A1 | 9/2005 | Oohata | 257/99 |
| 2005/0196886 A1 | 9/2005 | Jager et al. | |
| 2005/0211991 A1 | 9/2005 | Mori et al. | |
| 2005/0218421 A1 | 10/2005 | Andrews et al. | |
| 2005/0219835 A1 | 10/2005 | Nagayama | |
| 2005/0221519 A1 | 10/2005 | Leung et al. | |
| 2005/0224821 A1 | 10/2005 | Sakano et al. | |
| 2005/0224830 A1 | 10/2005 | Blonder et al. | |

(56) References Cited

U.S. PATENT DOCUMENTS

| | | | |
|---|---|---|---|
| 2005/0243237 A1 | 11/2005 | Sasuga | 349/57 |
| 2005/0253151 A1 | 11/2005 | Sakai et al. | |
| 2005/0259423 A1 | 11/2005 | Heuser et al. | 362/293 |
| 2005/0265404 A1 | 12/2005 | Ashdown | |
| 2005/0269592 A1* | 12/2005 | Lee et al. | 257/100 |
| 2005/0280894 A1 | 12/2005 | Hartkop et al. | |
| 2006/0001046 A1 | 1/2006 | Batres et al. | |
| 2006/0003477 A1 | 1/2006 | Braune et al. | 438/29 |
| 2006/0012299 A1 | 1/2006 | Suehiro et al. | |
| 2006/0027820 A1 | 2/2006 | Cao | 257/89 |
| 2006/0054076 A1 | 3/2006 | Dwilinski et al. | |
| 2006/0060867 A1 | 3/2006 | Suehiro | |
| 2006/0060872 A1 | 3/2006 | Edmond et al. | |
| 2006/0060874 A1 | 3/2006 | Edmond et al. | |
| 2006/0060879 A1 | 3/2006 | Edmond et al. | |
| 2006/0065906 A1 | 3/2006 | Harada | |
| 2006/0091788 A1 | 5/2006 | Yan | |
| 2006/0102991 A1 | 5/2006 | Sakano | |
| 2006/0118510 A1 | 6/2006 | Fujii | |
| 2006/0124947 A1 | 6/2006 | Mueller et al. | 257/98 |
| 2006/0124953 A1 | 6/2006 | Negley et al. | |
| 2006/0138937 A1 | 6/2006 | Ibbetson | |
| 2006/0145170 A1 | 7/2006 | Cho | 257/95 |
| 2006/0157721 A1 | 7/2006 | Tran et al. | |
| 2006/0163589 A1 | 7/2006 | Fan et al. | |
| 2006/0186431 A1 | 8/2006 | Miki et al. | |
| 2006/0189098 A1 | 8/2006 | Edmond | |
| 2006/0202105 A1 | 9/2006 | Krames et al. | |
| 2006/0226758 A1 | 10/2006 | Sofue et al. | |
| 2006/0267042 A1 | 11/2006 | Izuno | |
| 2006/0284195 A1 | 12/2006 | Nagai | |
| 2007/0012940 A1 | 1/2007 | Suh et al. | |
| 2007/0034995 A1 | 2/2007 | Kameyama | |
| 2007/0037307 A1 | 2/2007 | Donofrio | |
| 2007/0045641 A1 | 3/2007 | Yin Chua et al. | |
| 2007/0045761 A1 | 3/2007 | Basin et al. | |
| 2007/0080358 A1 | 4/2007 | Tsai | |
| 2007/0080635 A1 | 4/2007 | Wang | |
| 2007/0092636 A1 | 4/2007 | Thompson et al. | |
| 2007/0096131 A1 | 5/2007 | Chandra | |
| 2007/0114559 A1 | 5/2007 | Sayers et al. | 257/100 |
| 2007/0120135 A1 | 5/2007 | Soules et al. | |
| 2007/0128745 A1 | 6/2007 | Brukilacchio et al. | |
| 2007/0138941 A1 | 6/2007 | Jin et al. | 313/503 |
| 2007/0148332 A1 | 6/2007 | Lee et al. | |
| 2007/0158668 A1 | 7/2007 | Tarsa et al. | |
| 2007/0158669 A1 | 7/2007 | Lee et al. | |
| 2007/0161135 A1 | 7/2007 | Keller et al. | |
| 2007/0165403 A1 | 7/2007 | Park | |
| 2007/0215890 A1 | 9/2007 | Harbers et al. | |
| 2007/0259206 A1 | 11/2007 | Oshio | |
| 2007/0278502 A1 | 12/2007 | Shakuda et al. | 257/88 |
| 2008/0006815 A1 | 1/2008 | Wang et al. | |
| 2008/0089053 A1 | 4/2008 | Negley | |
| 2008/0106893 A1 | 5/2008 | Johnson et al. | |
| 2008/0149945 A1 | 6/2008 | Nagai | |
| 2008/0173884 A1 | 7/2008 | Chitnis et al. | 257/98 |
| 2008/0179609 A1 | 7/2008 | Trottier et al. | |
| 2008/0203410 A1 | 8/2008 | Brunner et al. | |
| 2008/0217579 A1 | 9/2008 | Ishida et al. | |
| 2008/0217635 A1 | 9/2008 | Emerson et al. | |
| 2008/0283865 A1 | 11/2008 | Yoo | |
| 2008/0315235 A1 | 12/2008 | Murazaki | |
| 2009/0072847 A1 | 3/2009 | Lee et al. | |
| 2009/0086492 A1 | 4/2009 | Meyer | 362/294 |
| 2009/0101930 A1 | 4/2009 | Li | 257/98 |
| 2009/0134414 A1 | 5/2009 | Li et al. | |
| 2009/0154195 A1 | 6/2009 | Ishii et al. | |
| 2009/0179213 A1 | 7/2009 | Cannon et al. | |
| 2009/0261366 A1 | 10/2009 | Eisert et al. | |
| 2009/0322197 A1 | 12/2009 | Helbing | 313/46 |
| 2010/0081218 A1 | 4/2010 | Hardin | |
| 2010/0155763 A1 | 6/2010 | Donofrio et al. | |
| 2010/0181582 A1 | 7/2010 | Li et al. | |
| 2010/0289044 A1 | 11/2010 | Krames et al. | |
| 2010/0295078 A1 | 11/2010 | Chen et al. | |
| 2010/0314656 A1 | 12/2010 | Jeong et al. | |
| 2010/0323465 A1 | 12/2010 | Leung et al. | |
| 2011/0180780 A1* | 7/2011 | Yoo et al. | 257/13 |
| 2011/0248305 A1* | 10/2011 | Ling | 257/98 |
| 2012/0043886 A1* | 2/2012 | Ji et al. | 315/51 |
| 2012/0129282 A1* | 5/2012 | Hsia et al. | 438/27 |

FOREIGN PATENT DOCUMENTS

| | | |
|---|---|---|
| CN | 1866561 A | 11/2006 |
| DE | 19638667 | 4/1998 |
| DE | 19945672 A1 | 4/2000 |
| DE | 69702929 | 2/2001 |
| DE | 102005000800 | 8/2005 |
| DE | 102005013265 | 12/2005 |
| DE | 202005042814 | 4/2006 |
| DE | 102005062514 | 3/2007 |
| EP | 1365215 A2 | 1/1924 |
| EP | 1059678 | 12/2000 |
| EP | 1138747 A2 | 10/2001 |
| EP | 1198016 A2 | 10/2001 |
| EP | 1198005 A | 4/2002 |
| EP | 1198016 A2 | 4/2002 |
| EP | 1367655 | 12/2003 |
| EP | 1017112 | 7/2005 |
| EP | 1724848 A2 | 11/2006 |
| EP | 1804304 A2 | 7/2007 |
| EP | 0732740 A2 | 1/2008 |
| FR | 2704690 | 11/1994 |
| JP | 61048951 | 3/1986 |
| JP | 59027559 | 2/1987 |
| JP | 02086150 | 3/1990 |
| JP | 40208615 0 | 3/1990 |
| JP | 4233454 | 8/1992 |
| JP | 10107325 | 4/1998 |
| JP | 10163525 | 6/1998 |
| JP | 10247750 A | 9/1998 |
| JP | 10261821 A | 9/1998 |
| JP | H0261821 | 9/1998 |
| JP | 11040858 | 2/1999 |
| JP | 11087778 | 3/1999 |
| JP | 11276932 | 10/1999 |
| JP | 2002101147 | 4/2000 |
| JP | 2000164937 | 6/2000 |
| JP | 2000208820 A | 7/2000 |
| JP | 2000208822 | 7/2000 |
| JP | 2000277551 A | 10/2000 |
| JP | 2000349346 | 12/2000 |
| JP | 2001181613 | 7/2001 |
| JP | 2001308116 A | 11/2001 |
| JP | 2002009097 A | 1/2002 |
| JP | 2002050799 | 2/2002 |
| JP | 2002076445 | 3/2002 |
| JP | 2002093830 | 3/2002 |
| JP | 2002118293 | 4/2002 |
| JP | 2002261325 | 9/2002 |
| JP | 2002280607 | 9/2002 |
| JP | 2002374006 | 12/2002 |
| JP | 2003007929 | 1/2003 |
| JP | 2003046141 | 2/2003 |
| JP | 03021668 | 3/2003 |
| JP | 2003110153 | 4/2003 |
| JP | 2003115614 | 4/2003 |
| JP | 2003170465 | 6/2003 |
| JP | 2003197655 | 7/2003 |
| JP | 2003224307 | 8/2003 |
| JP | 2003234511 | 8/2003 |
| JP | 2003258011 | 9/2003 |
| JP | 2003282952 A | 10/2003 |
| JP | 2003318448 | 11/2003 |
| JP | 2004031856 | 1/2004 |
| JP | 2004095765 | 3/2004 |
| JP | 2004134699 | 4/2004 |
| JP | 2004186488 | 7/2004 |
| JP | 2004221185 | 8/2004 |
| JP | 2004266240 | 9/2004 |
| JP | 3589187 B2 | 11/2004 |
| JP | 2004363342 | 12/2004 |

(56) References Cited

FOREIGN PATENT DOCUMENTS

| | | |
|---|---|---|
| JP | 2005005604 | 1/2005 |
| JP | 2005019838 | 1/2005 |
| JP | 2005033138 | 2/2005 |
| JP | 2005064113 | 3/2005 |
| JP | 2005167079 | 6/2005 |
| JP | 2005252222 | 9/2005 |
| JP | 2005298817 | 10/2005 |
| JP | 2006032387 | 2/2006 |
| JP | 2006049533 | 2/2006 |
| JP | 2006054209 | 2/2006 |
| JP | 2006080565 | 3/2006 |
| JP | 2006114637 | 4/2006 |
| JP | 2006165416 | 6/2006 |
| JP | 2006245020 | 9/2006 |
| JP | 2006253370 | 9/2006 |
| JP | 2006313886 | 11/2006 |
| JP | 2007063538 | 3/2007 |
| JP | 2008129043 | 6/2008 |
| JP | 2008218511 | 9/2008 |
| JP | 2008541412 A | 11/2008 |
| JP | 2010080588 A | 4/2010 |
| JP | 2000299334 | 10/2010 |
| KR | 200417926 | 2/2004 |
| KR | 200429313 | 4/2004 |
| KR | 200412776 | 11/2004 |
| TW | 522423 | 3/2003 |
| TW | 581325 U | 3/2004 |
| TW | 595012 | 6/2004 |
| WO | 0033390 | 6/2000 |
| WO | WO 0124283 A1 | 4/2001 |
| WO | 02061847 | 8/2002 |
| WO | 02061847 A2 | 8/2002 |
| WO | 03001612 | 1/2003 |
| WO | 03021691 A1 | 3/2003 |
| WO | 2004020704 | 3/2004 |
| WO | 2005101909 | 10/2005 |
| WO | 2006033695 A2 | 3/2006 |
| WO | 2006036251 A1 | 4/2006 |
| WO | 2006065015 | 6/2006 |
| WO | 2006135496 A2 | 12/2006 |
| WO | 2007018560 | 2/2007 |
| WO | 2007136956 | 11/2007 |
| WO | 2009093163 A2 | 7/2009 |

OTHER PUBLICATIONS

International Preliminary Report on Patentability Corresponding to International Application No. PCT/US2011/025794; Date of Mailing; Sep. 13, 2012; 9 Pages.
International Search Report Corresponding to International Application No. PCT/US2012/021630; Date of Mailing: May 23, 2012; 14 Pages.
International Preliminary Report on Patentability Corresponding to International Application No. PCT/US2012/023069; Date of Mailing; Aug. 15, 2013; 12 Pages.
International Preliminary Report on Patentability Corresponding to International Application No. PCT/US2012/021630; Date of Mailing; Aug. 15, 2013; 13 Pages.
Japanese Office Action w/translation for Japanese Patent Application No. 2012-556103; dated Oct. 17, 2013, (1 pg.), Translation (3 pgs.).
Office Action (Brief Description of) from Chinese Patent Appl. 2010102790162, dated Jan, 10. 2014 (P0445CN2-7).
Ipt's Decision from Korean Patent Appl. No, Oct. 2007-7008694, dated Dec. 24, 2013 (P0445KR-7).
US Publication No. US 2004/0037949. dated: Feb. 2004, to Wright.
US Publication No. US 2004/0004435. dated: Jan. 2004, to Hsu.
US Publication No. US 2004/0038442, dated: Feb. 2004, to Kinsman.
US Publication No. US 2003/0207500. dated: Nov. 2003, to Pichler et al.
US Publication No. US 2003/0066311, dated: Apr. 2003, to Li at al.
US Publication No. US 2004/0106234, dated: Jun. 2004, to Sorg at al.
US Publication No. US 2002/0024299, dated: Feb. 2002, to Okazaki.
US Publication No, US 2005/0002168, dated: Jan. 2005, to Narhi at al.
US Publication No, US 2002/0006040, dated: Jan. 2002, to Kamada at al.
US Publication No, US 2004/0031952. dated: Feb. 2004. to Oosedo at al,.
US 2002/0001869 A1, Fjelstad, Joseph, Jan. 3, 2002.
US2002/0096789 A1, Bolken, Todd O., Jul. 25, 2002.
Second Office Action from Chinese Patent appl. No. 200780050127. 2, dated Jun. 15, 2011.
Office Action from Taiwan Patent Appl. No. 093128231 issued Apr. 21, 2011.
Noting of Loss of Rights from EU Patent appl. No. 04783941.0-2203/1665.61, dated Nov. 6. 2012.
Office Action from Japanese Patent appl. No. 2011-224055, Feb. 7, 2013.
Notification of Reasons for Rejection from Japanese Patent Appl. No. 2011-279356, dated Jan. 23, 2013.
Appeal Decision to Grant a Patent from Japanese Patent No. 2007-506279. dated Oct. 28. 2013.
Office Action from related U.S. Appl. No. 10/666,399. dated: Nov. 18, 2004.
Response to related Office Action U.S. Appl. No. 10/666,399. dated: Mar. 18, 2005.
Office Action from related U.S. Appl. No. 10/666,399, dated: May 13, 2005.
Response to related Office Action U.S. Appl. No. 10/666,399, dated: Aug. 15, 2005.
Office Action from related U.S. Appl. No. 10/666,399, dated: Sep. 30, 2005.
Response to related Office Action U.S. Appl. No. 10/666,399. dated: Jun. 30, 2006.
Office Action from related U.S. Appl. No. 10/666,399, dated: Feb. 28, 2006.
Response to related Office Action U.S. Appl. No. 10/666,399, dated: Jun. 28, 2006.
Office Action from related U.S. Appl. No. 10/666,399, dated: Aug. 30, 2006.
Response to related Office Action U.S. Appl. No. 10/666,399, dated: Nov. 30, 2006.
Office Action from related U.S. Appl. No. 10/666,399, dated: Feb. 14, 2007.
Response to related Office Action U.S. Appl. No. 10/666,399, dated: Jun. 18, 2007.
Office Action from related U.S. Appl. No. 10/666,399. dated: Jul. 19, 2007.
Response to related Office Action U.S. Appl. No. 10/666,399, dated: Jan. 22, 2008.
Office Action from related U.S. Appl. No. 10/666,399, dated: Sep. 5, 2008.
Response to related Office Action U.S. Appl. No. 10/666,399, dated: Feb. 05, 2009.
Office Action from related U.S. Appl. No. 10/666,399. dated: Mar. 6, 2009.
Response to related Office Action U.S. Appl. No. 10/666,399. dated: Sep. 8, 2009.
Office Action from related U.S. Appl. No. 10/666.399, dated: Dec. 22, 2009.
Response to related Office Action U.S. Appl. No. 10/666,399, dated: Mar. 22, 2010.
Frist Office Action from EU Patent Appl. No. 07754163.9 dated Feb. 28, 2011.
Official Notice of Final Decision of Rejection re: related Japanese Patent Appl. No. 2007-533459, dated Dec. 26. 2008.
Rejection Decision from Chinese Patent appl No. 200580031362.3 dated Feb. 2, 2009.
Communication pursuant to Article 94(3) EPC from EU Appl. No. 05808825.3. dated Feb. 18, 2009.
PCT Search Report and Written Opinion from PCT Appl. No. US2007/007600, dated Oct. 31, 2007.
Office Action from Korean Patent Appl. No. 10-2007-7008694, mailed Aug. 7, 2011.

(56) References Cited

OTHER PUBLICATIONS

Office Action from Korean Patent appl No. 10-2009-7017405, dated Oct. 23, 2013.
First Office Action and Search Report from Chinese Patent Appl. No. 201210030627.2, dated Dec. 3. 2012.
Office Action from Patent Appl. No. 12/862.640. dated Dec. 20, 2013.
Office Action from Patent U.S. Appl. No. 11/656,759, dated Nov. 18, 2013.
Examination Report from EU Patent appl. No. 04 783 941.0-1555, dated Jul. 25, 2013.
Notification of Reasons for Rejection from Japanese Patent Appl. No 2009-547219 dated Sep. 16, 2011.
International Preliminary Examination Report from PCT Application No. PCT/US07/24367 mailed Jun. 29. 2011.
Notice of Allowance from Korean Patent Appl. No. 10-2009-7017405. dated Feb. 18, 2014.
Search Report from Taiwanese Patent appl. No. 096143968. dated: Feb. 17, 2014.
International Preliminary Examination Report from PCT Appl. No. PCT/US07/24366 mailed Jun. 2011.
Decision to Refuse a European Patent Appl. Regarding EP 05 806 825.3 dated Jun. 14, 2011.
Notice of Reasons for Rejection from Japanese Patent appl. No. 2008-317576 dated Sep. 13, 2011.
Notification of the First Office Action from Chinese Patent Appl. No. 201110029365,3 mailed Jan. 4. 2012.
Notice of Rejection of Japanese Patent appl. No. 2006-526964 issued Sept, 13, 2011.
Notification of Reasons for Rejection for Japanese Patent appl. No. 2009-547218 dated Sep. 16, 2011.
Notice of Rejection (Final) from Japanese Patent Appl. No. 2006-526964. dated Oct, 5, 2010.
Minutes of Oral Proceedings (EPO Form 2009) from European Patent Appl. No. 05808825.3 dated Feb. 23. 2011.
Summons to Attend Oral Proceedings in EU patent appl. No. 05808825.3, dated Feb. 23, 2011.
Office Action from U.S. Appl. No. 12/506,989, dated Sep. 5, 2013.
Office Action from U.S. Appl. No. 11/899,790, dated Sep. 17, 2013.
Office Action from U.S. Appl. No. 12/008,477, dated Sep. 3, 2013.
Official Notice of Rejection from Japanese Patent Application No. 2006-526964, dated: Feb. 16, 2010.
Notice of ReExamination for Chinese Application No. 200580031382.3. dated: May 28, 2010.
Office Action from U.S. Appl. No. 12/506,989, dated: Apr. 7, 2010.
Response to Office Action for U.S. Appl. No. 12/506,989, filed May 24, 2010.
Office Action from U.S. Appl. No. 10/666,399, dated: Apr. 16, 2008.
Response to Office Action for U.S. Appl. No. 10/666,399, filed Jun. 16, 2008.
Office Action from U.S. Appl. No. 10/666,399, dated: May 11, 2010.
Response to Office Action U.S. Appl. No. 10/666,399, filed Aug. 11, 2010.
Office Action from U.S. Appl. No. 12/506.989, dated: Jul. 23, 2010.
Office Action from U.S. Appl. No. 11/656,759, dated: Nov. 25, 2009.
Response to Office Action U.S. Appl. No. 11/656,759, filed Apr. 26, 2010.
Office Action from U.S. Appl. No. 11/982,276, dated: Dec. 7, 2009.
Response to Office Action U.S. Appl. No. 11/982,276, filed Feb. 5, 2010.
Office Action from U.S. Appl. No. 12/077,638, dated: Dec. 8, 2009.
Reply to Office Action U.S. Appl. No. 12/077,638 filed Feb. 26, 2010.
Office Action from U.S. Appl. No. 12/008,477, dated: Mar. 1, 2010.
Response to Office Action U.S. Appl. No. 12/008,477, filed May 26, 2010.
Office Action from U.S. Appl. No. 11/881,683, dated: Feb. 5, 2010.
Response to Office Action U.S. Appl. No. 11/881,683, filed Apr. 28, 2010.
Office Action from U.S. Appl. No. 11/398,214, dated: Dec. 11, 2009.
Response to Office Action U.S. Appl. No. 11/398,214, filed Mar. 2, 2010.
Notice of Rejection (Final) in Japanese Patent Appl. No. 2006-526964. dated Feb. 22, 2011.
Notice of Reasons for Rejection from Japanese Patent appl. No. 2012-026326, dated May 28, 2013.
Notice of Reasons for Rejection from Japanese Patent Appl. No. 2012-026327, dated May 28, 2013.
NPO-30394, Electrophoretic Deposition for Fabricating Microbatteries, p. 1-2. Nasa Tech Briefs Issue. May 3, 2003.
Notice of Results of Re-Consideration prior to Appeal from Korean Patent appl. No. 10-2007-7008694. dated Sep. 21. 2012.
Rejection Decision from Chinese Patent appl. No. 201110029365.3, dated Sep. 10. 2012.
International Search Report and written Opinion from PCT/US2009/001572, dated Jul. 17, 2009.
Lau, John, "Flip-Chip Technologies". Mcgraw Hill, 1996.
International Materials Reviews. "Materials for Field Emission Displays", A.P. Burden 2001.
Summons to attend oral proceedings pursuant to Rule 115(1) EPC, for Application No. 05808825.302203/1797597. dated: Sep. 9, 2010.
Notification of the First Office Action for China Application No. 200780050127.2, dated: Aug. 12, 2010.
International Search Report and Written Opinion for PCT/US2007/024367, dated Oct. 22, 2008.
Official Notice of Rejection for Japan Application No. 2007-533459, dated: Jul. 16, 2010.
Notice of the First Office Action for China Application No. 200780012387.0, dated: Jun. 30, 2010.
Notification of First Office Action for China Application No. 200780050197.8, date: Sep. 10, 2010.
Notification of Re-Exam for China Application No. 200580031382.3, date: Oct. 27, 2010.
Office Action from U.S. Appl. No. 11/982,276, mailed Aug. 19, 2010.
Response to Office Action from U.S. Appl. No, 11/982,276, filed Nov. 2, 2010.
Office Action from U.S. Appl. No. 11/899,790, mailed on Jun. 2, 2010.
Response to Office Action for U.S. Appl. No. 11/899,790, filed Nov. 1, 2010.
Office Action from U.S. Appl. No. 11/881,683, mailed May 12, 2010.
Response to Office Action for U.S. Appl. No. 11/881,683, filed Aug. 3, 2010.
Office Action from U.S. Appl. No. 11/595,720, mailed May 14, 2010.
Response to Office Action for U.S. Appl. No. 11/595.720. mailed: Jul. 6, 2010.
Notice of Allowance for U.S. Appl. No. 10/666,399. mailed Oct. 14, 2010.
Office Action for Application No. 12/077,638. mailed Jul. 7, 2010.
Response to Office Action for U.S. Appl. No. 12/077,638, filed Aug. 30, 2010.
Office Action for U.S. Appl. No. 11/982,276, mailed Mar. 25, 2010.
Response to Office Action for U.S. Appl. No. 11/982,276. mailed Jun. 21, 2010.
Office Action for U.S. Appl. No. 12/077,638, mailed Sep. 22, 2010.
Office Action for U.S. Appl. No. 12/077,638, mailed Dec. 21, 2010.
Office Action for U.S. Appl. No. 11/827,626. mailed Oct. 7, 2010.
Office Action for U.S. Appl. No. 12/008,477. mailed Oct. 7, 2010.
Office Action for U.S. Appl. No. 12/506,989, mailed Mar. 8, 2011.
Office Action for U.S. Appl. No. 11/656,759, mailed Mar. 9, 2011.
Office Action for U.S. Appl. No. 11/656,759, mailed May 21, 2010.
Office Action for Application No. 11/398,214, mailed Nov. 12, 2010.
Office Action for U.S. Appl. No. 11/881,683, mailed Oct. 14, 2010.
Office Action for U.S. Appl. No. 11/827,626, mailed Apr. 1, 2011.
Office Action for U.S. Appl. No. 11/899.790. mailed Mar. 21, 2011.
Office Action U.S. Appl. No. 11/656,759, mailed Sep. 23, 2011.
Response to Office Action U.S. Appl. No. 11/656,759, filed Jan. 16, 2012.
Office Action U.S. Appl. No. 12/008,477, mailed Sep. 19, 2011.
Response to Office Action U.S. Appl. No. 12/008,477, filed Jan. 25, 2012.
Office Action U.S. Appl. No. 12/862,640, mailed Aug. 19, 2011.

(56) References Cited

OTHER PUBLICATIONS

Response to Office Action U.S. Appl. No. 12/862,640, filed Feb. 21, 2012.
Office Action Application No. 12/287,764, mailed Oct. 26, 2011.
Response to Office Action U.S. Appl. No. 12/287.764, filed Mar. 6, 2012.
Office Action U.S. Appl. No. 11/899,790. mailed Jan. 12, 2012.
Response to Office Action U.S. Appl. No. 11/899,790, filed Mar. 8, 2012.
Office Action U.S. Appl. No. 12/862,640. mailed Mar. 9, 2012.
Office Action U.S. Appl. No. 12/287,764. mailed Jan. 13, 2011.
Response to Office Action U.S. Appl. No. 12/287,764, filed May 5, 2011.
Office Action from U.S. Appl. No. 12/506,989, mailed Dec. 27, 2011.
Office Action U.S. Appl. No. 12/008.477, mailed Apr. 12, 2011.
Response to Office Action U.S. Appl. No. 12/008,477, filed Jun. 27, 2011.
Office Action U.S. Appl. No. 11/899,790, mailed Jul. 27, 2011.
Response to Office Action U.S. Appl. No. 11/899,790, filed Nov. 22, 2011.
Office Action U.S. Appl. No. 12/287,764, mailed Jul. 30, 2010.
Response to Office Action U.S. Appl. No. 12/287,764, filed Nov. 30, 2010.
Office Action U.S. Appl. No. 11/956,989, mailed Apr. 16, 2010.
Response to Office Action U.S. Appl. No. 11/956,989, filed Jun. 14, 2010.
Response to Office Action U.S. Appl. No. 11/956,989, filed Jul. 14, 2010.
Office Action U.S. Appl. No. 12/287,764, mailed Mar. 25, 2010.
Response to Office Action U.S. Appl. No. 12/287,764, filed Jul. 21, 2010.
Office Action U.S. Appl. No. 12/287,764, mailed May 17, 2011.
Response to Office Action U.S. Appl. No. 12/287,764, filed Oct. 10, 2011.
Office Action U.S. Appl. No. 13/072,371, mailed Oct. 5, 2011.
Response to Office Action U.S. Appl. No. 13/072.371, filed Dec. 23, 2011.
Office Action from Patent U.S. Appl. No. 13/072,371, dated Mar. 29, 2012.
Response to OA from Patent U.S. Appl. No. 13/072,371, filed May 16, 2012.
Office Action from Patent U.S. Appl. No. 11/656.759, dated May 1, 2012.
Response to OA from U.S. Appl. No. 11/656,759, filed Jun. 26, 2012.
Office Action from U.S. Appl. No. 12/662,640, dated Jun. 29, 2012.
Response to OA from U.S. Appl. No. 12/862.640, filed Sep. 20, 2012.
Office Action from U.S. Appl. No. 12/506,989, dated Jul. 6, 2012.
Response to OA from U.S. Appl. No. 12/506,989, filed Oct. 11, 2012.
Office Action from U.S. Appl. No. 13/072,371, dated Jul. 23, 2012.
Response to OA from U.S. Appl. No. 13/072,371, filed Oct. 17, 2012.
Office Action from U.S. Appl. No. 12/842,639, dated Aug. 14, 2012.
Response to OA from U.S. Appl. No. 12/842,639, filed Nov. 9, 2012.
Office Action from U.S. Appl. No. 12/862,640. dated Oct. 2, 2012.
Response to OA from U.S. Appl. No. 12/862,640, filed Apr. 17, 2013.
Office Action from U.S. Appl. No. 12/506,989. dated Oct. 24, 2012.
Response to OA from U.S. Appl. No. 12/506,989, filed Dec. 4, 2012.
Office Action from U.S. Appl. No. 11/899,790, dated Dec. 5, 2012.
Response to OA from U.S. Appl. No. 11/899,790, filed Feb. 27, 2013.
Office Action from U.S. Appl. No. 12/506,989, dated Jan. 18, 2013.
Response to OA from U.S. Appl. No. 12/506,989, filed Apr. 18, 2013.
Office Action from U.S. Appl. No. 12/862,640, dated Jan. 24, 2013.
Office Action from U.S. Appl. No. 13/072,371. dated Jan. 30, 2013.
Response to OA from U.S. Appl. No. 13/072.371, filed Apr. 22, 2013.
Office Action from U.S. Appl. No. 11/656,759, dated Feb. 13, 2013.
Response to OA from U.S. Appl. No. 11/656,759, filed May 13, 2013.
Office Action from U.S. Appl. No. 11/656.759, dated Jul. 2, 2013.
Response to OA from U.S. Appl. No. 11/656,759, filed Aug. 21, 2013.
Office Action from U.S. Appl. No. 11/899,790. dated May 1, 2013.
Response to OA from U.S. Appl. No. 11/899,790, filed Jun. 18, 2013.
Office Action from U.S. Appl. No. 13/072,371, dated Apr. 30, 2013.
Office Action from U.S. Appl. No. 12/862,640. dated Apr. 30, 2013.
Office Action from U.S. Appl. No. 12/842,639. dated Mar. 7, 2013.
Response to OA from U.S. Appl. No. 12/842,639, filed Jun. 5, 2013.
Interrogation from Japanese Patent Appl. No. 2008-317576, dated Jul. 9. 2013.
Decision of Final Rejection from Japanese Patent Appl. No. 2011-224055, dated Jul. 26, 2013.
Decision of Rejection from Japanese Patent appl. No. 2011-279356, dated Jul. 31, 2013.
Notice of Rejection from Japanese Patent Appl. No. 2008-527912, dated Jun. 5, 2013.
Notice of Rejection from Japanese Patent Appl. No. 2008-527912 issued Jun. 14. 2011.
International Preliminary Report on Patentability from Appl. No. PCT/US06/24884 dated: Jun. 12, 2008.
Nichia Corp. White LED, Part No. NSPW312BX, "specification for Nichia White LED, Model NSW312BS", pp. 1-14, 2004.
Nichia Corp. White LED, Part No. NSPW300BS, Specifications for Nichia White LED, Model NSPW300BS, pp. 1-14, 2004.
Office Action from Japanese Patent Appl. No. 2007-216808, mailed Sep. 6, 2010.
Office Action from Japanese Patent Appl. No. 2011-224055, Jan. 12, 2012.
Decision of Final Rejection from Japanese Patent Appl. No. 2007-216808, dated Jan. 1, 2011.
Office Action from German Patent Appl. No. 10 2007 040 841.4-33, dated Sep. 17, 2009.
Office Action from German Patent Appl. No. 10 2007 040 811.2, dated Sep. 17, 2009.
Office Action from Chinese Patent Appl. No. 20070148326.9, dated Jun. 19, 2009. 2 pages.
Schubert. "Light-Emitting Diodes". Cambridge University Press. 2003, pp. 92-96.
Rejection Decision from Taiwanese Patent Appl. No. 094122646, dated Dec. 14, 2012.
Decision of Rejection from Japanese Patent Appl No. 2008-317576, dated Dec. 18, 2012.
Decision of Rejection from Japanese Patent Appl. No. 2006-526564, dated Dec. 18, 2012.
Second Office Action from Chinese Patent Application No. 20101029016.2, dated Dec, 24. 2012.
Official Action from European Patent Application No. 07874432.3, dated Nov. 13. 2012.
Official Action from European Patent Application No. 07840092.6, dated Nov. 13, 2012.
Decision of Rejection from Japanese Patent Appl. No. 2012-026327, dated Apr. 8. 2014.
Brief Summary of Rejection Decision from Chinese Patent Appl. No. 201010279016.2 dated Apr. 22. 2014.
Office Action from Korean Patent Appl. No. 10-2009-7017407. dated Apr. 28, 2014.
Notification of Reexamination from Chinese Patent appl. No. 201110029365.3 dated May 7. 2014.
Office Action from U.S. Appl. No. 13/429,053, dated Apr. 11, 2014.
Office Action from U.S. Appl. No. 12/008,477, dated Apr. 25, 2014.
Response to OA from U.S. Appl. No. 12/008,477, filed May 27, 2014.
Office Action from U.S. Appl. No. 13/072,371. dated Apr. 29, 2014.
Office Action from U.S. Appl. No. 11/656,759. dated May 27, 2014.
Notification of Reexamination from Chinese Patent Appl. No. 200780050127.2, dated Jun. 3. 2014.
Notification of Allowance from Taiwan Patent Appl. No. 101130701, dated Jul. 15. 2014.
Office Action and Search Report from Taiwan Patent Appl. No. 097110195, dated Jul. 18. 2014.
Letter regarding unfavorable decision on appeal from Japanese Appl. No. 2011-279356, dated Nov, 12. 2014.
Preliminary Examination Report from Japanese Appl. No. 2012-026326. dated Oct. 1. 2014.
Third Office Action from Chinese Appl, No. 201210175686.9, dated Dec. 11, 2014.
Office Action from U.S. Appl. No. 13/429,053, dated Sep. 22, 2014.
Office Action from U.S. Appl. No. 12/852,640, dated Oct. 17, 2014.

(56) References Cited

OTHER PUBLICATIONS

Office Action from U.S. Appl. No. 11/899,790, dated Jun. 25, 2014.
Board Decision from Chinese Patent Appl. No. 201110029365.3. dated Aug. 13. 2014.
Second Office Action from Chinese Patent Appl. No. 201211175686.9, dated Sept, 3, 2014.
Office Action from Taiwanese Patent Appl. No. 097110195, dated Sep. 9, 2014.
Office Action from U.S. Appl. No. 12/842,639, dated Aug. 6, 2014.
Office Action from U.S. Appl. No. 12/506,989, dated Aug. 8, 2014.
Reexamination Decision from Chinese Patent Appl. No. 200780050127 2, dated Jan. 5. 2015.
Office Action from U.S. Appl. No. 14/209,652, dated Dec. 12, 2014.
Office Action from U.S. Appl. No. 12/506,989. dated Jan. 21, 2015.
Fourth Examination from European Patent Appl. No. 04 783 941.0—1552, dated Oct. 7, 2014.
Summons to attend oral proceedings from European Patent Appl. No. 411.52.106724/0. dated Sep. 9, 2014.
Notification of re-examination from Chinese Appl. No. 2010102790162, dated Jan. 9, 2015.
Summons to attend Oral Proceedings from European Appl. No. 08171399.2, dated Jan. 16, 2015.
Decision of Re-Examination from Chinese Appl. No. 201080001658.4, dated Dec. 29, 2014.
Office Action from Patent Application No. 12/842,639, dated Mar. 17, 2015 (P1206US-7).
Notice of Allowance from Taiwanese Patent appl. No. 097110195. dated Apr. 30, 2015.
Office Action from Taiwanese Patent Appl. No. 100107044 dated Jun. 4, 2015.
Notice of Final Rejection from Korean Appl. No. 10-2009-7017407, dated Feb. 27, 2015.
Notice of Allowance from Taiwanese Appl. No. 096143968, dated Mar. 10, 2015.

* cited by examiner

CONFORMALLY COATED LIGHT EMITTING DEVICES AND METHODS FOR PROVIDING THE SAME

BACKGROUND

This invention relates to coating of semiconductor devices. In particular, this invention relates to the application of optical materials to optical elements that are mounted on a substrate. In particular embodiments, the invention relates to substrates used in conjunction with the application of optical coatings, such as phosphors and/or other particles, to optical elements of a semiconductor based light emitting device, such as light emitting diode based devices. In yet other embodiments, the invention relates to spraying optical elements with phosphor and/or other particles.

Light emitting diodes (LEDs) are semiconductor devices that convert electric energy to light. Inorganic LEDs typically include an active layer of semiconductor material formed between two oppositely doped layers. When a bias is applied across the active region, holes and/or electrons are injected into the active region. Recombination of holes and electrons in the active region generates light that can be emitted from the LED. The active region may include a single and/or double heterojunction, quantum well, or multiple quantum well structures with corresponding barrier layers and may include other layers. The structure of the device, and the material from which it is constructed, determine the intensity and wavelength of light emitted by the device. Recent advances in LED technology have resulted in highly efficient solid-state light sources that surpass the efficiency of incandescent and halogen light sources, providing light with equal or greater brightness in relation to input power.

Conventional LEDs generate narrow bandwidth, essentially monochromatic light. However, it is desirable to generate polychromatic light, such as white light, using solid state light sources. One way to produce white light from conventional LEDs is to combine different wavelengths of light from different LEDs. For example, white light can be produced by combining the light from red, green and blue emitting LEDs, or combining the light from blue and amber LEDs. This approach, however, requires the use of multiple LEDs to produce a single color of light, which can potentially increase the overall cost, size, complexity and/or heat generated by such a device. In addition, the different colors of light may also be generated from different types of LEDs fabricated from different material systems. Combining different LED types to form a white lamp can require costly fabrication techniques and can require complex control circuitry, since each device may have different electrical requirements and/or may behave differently under varied operating conditions (e.g. with temperature, current or time).

Light from a blue emitting LED has been converted to white light by surrounding the LED with a yellow phosphor, such as cerium-doped yttrium aluminum garnet (Ce:YAG). The phosphor material absorbs and "downconverts" some of the blue light generated by the LED. That is, the phosphor material generates light, such as yellow light, in response to absorbing the blue light. Thus, some of the blue light generated by the LED is converted to yellow light. Some of the blue light from the LED passes through the phosphor without being changed, however. The overall LED/phosphor structure emits both blue and yellow light, which combine to provide light that is perceived as white light.

LEDs have been combined with phosphor layers by dispensing a volume of phosphor-containing encapsulant material (e.g., epoxy resin or silicone) over the LED to cover the LED. In these methods, however, it can be difficult to control the geometry and/or thickness of the phosphor layer. As a result, light emitted from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Still another coating method for LEDs utilizes droplet deposition using systems similar to those in an ink-jet printing apparatus. Droplets of a liquid phosphor-containing material are sprayed from a print head. The phosphor-containing droplets are ejected from a nozzle on the print head in response to pressure generated in the print head by a thermal bubble and/or by piezoelectric crystal vibrations.

Problems with conventional methods of applying phosphor and/or other optical materials may include increased cost, complexity, clumping, dripping, settling, stratification, and/or separation, which may result in a reduced conformity and/or uniformity of the optical materials thus applied.

SUMMARY

Some embodiments of the present invention include light emitting structures that include a semiconductor light emitting diode (LED) including an active region. Embodiments may include a conformal phosphor coating including a first portion and a second portion, the first portion corresponding to at least one surface of the LED and the second portion extending from the first portion to form a conformal phosphor wing arranged around an edge of the LED.

In some embodiments, the LED includes a first surface, at least one side surface, and a second surface that is substantially opposite the first surface and the conformal phosphor wing includes at least one surface that is substantially parallel to the second surface. Some embodiments provide that the conformal phosphor wing includes a thickness of less than or equal to about 100 μm.

Some embodiments provide that the LED includes a transitional surface that defines a transition between the first surface and the at least one side surface.

In some embodiments, the conformal coating includes a first conformal coating that is applied to the LED and a second conformal coating that is applied to the first conformal coating. The first and second conformal coatings may each include light conversion particles that are configured to convert a portion of light received from the LED. In some embodiments, the first conformal coating includes first light conversion particles having first light conversion properties and the second conformal coating includes second light conversion particles having second light conversion properties that are different from the first light conversion properties.

Some embodiments of the present invention include methods for providing conformally coated light emitting devices. Methods may include temporarily bonding multiple light emitters to a bonding media. A conformal coating is applied to the light emitters. The conformal coating may form in gap areas between adjacent ones of the light emitters. The light emitters may be separated into individual light emitters. The individual light emitters may include the conformal coating that extends to a space corresponding to respective gap areas.

Some embodiments include arranging the plurality of light emitters proximate one another in at least one direction before applying the conformal coating. In some embodiments, arranging the light emitters includes arranging the light emitters based on relative emission characteristics. Some embodiments provide that the light emitters include a first light emitter having a first emission characteristic and a second light emitter having a second light emission characteristic that is different from the first light emission characteristic. The conformal coating may be applied in a first thickness to the first light emitter and a second thickness to the second light emitter, such that the first and second thicknesses are different from one another.

In some embodiments, the conformal coating includes a first conformal coating having first light conversion properties and a second conformal coating having second light conversion properties that are different from the first light conversion properties. The first conformal coating may be applied to the first light emitter and the second conformal coating may be applied to the second light emitter.

Some embodiments provide that the light emitters may be attached to a die sheet that is operable to support the light emitters while applying the conformal coating. In some embodiments, the light emitters may be removed from the die sheet after applying the conformal coating and before separating the light emitters.

Some embodiments provide that the light emitters may be arranged based on relative emission characteristics thereof on a die sheet that is operable to support the light emitters in a two-dimensional array that groups light emitters having similar emission characteristics together.

Some embodiments provide that the bonding media includes an adhesive bonding material and a support material that are operable to maintain a bond to the light emitters at temperatures of at least 150° C. In some embodiments, the bonding media includes a high temperature tape that is operable to bond the light emitters through a temperature greater than 150° C.

Some embodiments provide that ones of the light emitters include at least one wirebond conductor. In such embodiments, the wirebond conductor(s) may be masked before applying the conformal coating such that the conformal coating is not formed on the wirebond conductor(s).

In some embodiments, ones of the light emitters include at least one solder bump bond. In such embodiments, the conformal coating may be removed from the solder bump bond(s) to expose the solder bump bond(s) after applying the conformal coating.

In some embodiments, separating the light emitters includes mechanically breaking the conformal coating that is in the respective gap areas between ones of the light emitters. Some embodiments provide that separating the light emitters includes cutting the conformal coating that is in the respective gap areas between the ones of the light emitters.

In some embodiments, the conformal coating includes a first conformal coating having first light conversion properties and a second conformal coating having second light conversion properties that are different from the first light conversion properties. The first conformal coating may be applied to the emitters and then the second conformal coating may be applied to the light emitters.

Some embodiments of the present invention include a light emitting structure that includes a semiconductor light emitting diode (LED) including an active region. The structure may include a conformal coating including a first portion and a second portion. The first portion may correspond to at least one surface of the LED and the second portion may extend from the first portion. In some embodiments, the second portion of the conformal coating includes a ledge that is substantially circumferentially arranged around the LED.

Some embodiments provide that the LED includes a first surface, at least one side surface, and a second surface that is substantially opposite the first surface. The conformal coating may include a first side and a second side such that the first side of the first portion of the conformal coating is adjacent the first surface and the at least one side surface. In some embodiments, a first side of the second portion of the conformal coating is substantially parallel to the second surface of the LED.

In some embodiments, the LED includes a conductive portion on the first surface of the LED and the conductive portion is free of the conformal coating. Some embodiments provide that the conductive portion includes at least one of a solder bump bond and a wirebond conductor. In some embodiments, the LED includes a transitional surface that defines a transition between the first surface and the at least one side surface.

Some embodiments provide that the LED is one of multiple LEDs and the second portion of the conformal coating corresponds to conformal coating that was formed in at least one gap between adjacent conformally coated ones of the LEDs.

In some embodiments, the conformal coating includes a first conformal coating that is applied to the LED and a second conformal coating that is applied to the first conformal coating. The first and second conformal coatings each may include light conversion particles that are configured to convert a portion of light received from the LED. Some embodiments provide that the first conformal coating includes first light conversion particles having first light conversion properties and the second conformal coating includes second light conversion particles having second light conversion properties that are different from the first light conversion properties.

Some embodiments of the present invention include methods of providing conformally coated light emitters. Some embodiments of such methods include bonding multiple light emitters to a temporary bonding media that is operable to maintain a bond to the light emitters at temperatures of at least 150° C. The bonded light emitters may be arranged proximate one another based on relative emission characteristics thereof. A conformal coating may be applied to the light emitters and may be formed in gap areas between adjacent ones of the light emitters. The light emitters are separated into individual light emitters. The light emitters may include the conformal coating that extends to a space corresponding to respective gap areas.

In some embodiments, the light emitters include a first light emitter having a first emission characteristic and a second light emitter having a second light emission characteristic that is different from the first light emission characteristic. Some embodiments provide that a first thickness of the conformal coating may be applied to the first light emitter and a second thickness of the conformal coating may be applied to the second light emitter. The second thickness may be different than the first thickness.

In some embodiments, a first conformal coating having first light conversion properties is applied to the first light emitter and a second conformal coating having second light conversion properties that are different from the first light conversion properties is applied to the second light emitter.

Some embodiments provide that the light emitters are removed from the die sheet after applying the conformal coating and before separating the plurality of light emitters. In some embodiments, the light emitters may be arranged based on relative emission characteristics thereof on a die sheet that is operable to support the light emitters in a two-dimensional array that groups light emitters having similar emission characteristics together.

Some embodiments provide that applying the conformal coating to the light emitters includes heating the light emitters and applying the conformal coating to the heated light emitters. In some embodiments, the conformal coating is cured via thermal energy in the heated light emitters. Some embodiments include, after applying the conformal coating to the light emitters and before separating the light emitters, heating the light emitters for a given time period to cure the conformal coating.

Some embodiments of the present invention include methods of providing conformally coated light emitters. Some embodiments of such methods include bonding multiple light emitters to a temporary bonding media that is operable to maintain a bond to the light emitters at temperatures of at least 150° C. Methods may include positioning a separation fixture that includes grid wires between ones of the light emitters and applying a conformal coating to the light emitters. The conformal coating may form in gap areas between adjacent ones of the light emitters and on portions of the grid wires therebetween. The separation fixture may be removed from the light emitters to provide separating lines in the conformal coating between adjacent ones of the light emitters.

In some embodiments, a release agent may be applied to the grid wires to inhibit local curing of the conformal coating on the grid wire before applying the conformal coating.

Some embodiments of the present invention include light emitting structures that include a semiconductor light emitting diode (LED) that includes an active region including an n-type layer and a p-type layer. The LED may include a light emitting surface and a bonding surface that is opposite the light emitting surface. An n-type pad and a p-type pad are configured to be bonded to a bonding surface of a package that provides electrical connection to the n-type layer via the n-type pad and the p-type layer via the p-type pad. A conformal phosphor coating is provided on at least the light emitting surface.

In some embodiments, the n-type pad and the p-type pad are coplanar with the bonding surface.

Some embodiments provide that the LED is wirebond free.

In some embodiments, the LED includes a plurality of LEDS that each include the conformal phosphor coating.

Some embodiments provide that the LED is vertically oriented and that the p-type layer is below the n-type layer.

In some embodiments, the conformal phosphor coating includes a phosphor coating ledge extending from around an edge of the LED. Some embodiments provide that the phosphor coating ledge includes at least one surface that is substantially parallel to the bonding surface of the LED. In some embodiments, the phosphor coating ledge includes a thickness of less than or equal to about 100 µm.

Some embodiments provide that the LED includes a side surface and a transitional surface that defines a transition between the light emitting surface and the at least one side surface and that the conformal phosphor coating is formed on the side surface and the transitional surface.

In some embodiments, the conformal phosphor coating includes a first conformal coating that is applied to the LED and a second conformal coating that is applied to the first conformal coating. The first and second conformal coatings may each include light conversion particles that are configured to convert a portion of light received from the LED. In some embodiments, the first conformal coating includes first light conversion particles having first light conversion properties and the second conformal coating includes second light conversion particles having second light conversion properties that are different from the first light conversion properties.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying drawings, which are included to provide a further understanding of the invention and are incorporated in and constitute a part of this application, illustrate certain embodiment(s) of the invention.

DETAILED DESCRIPTION

Figure 1:
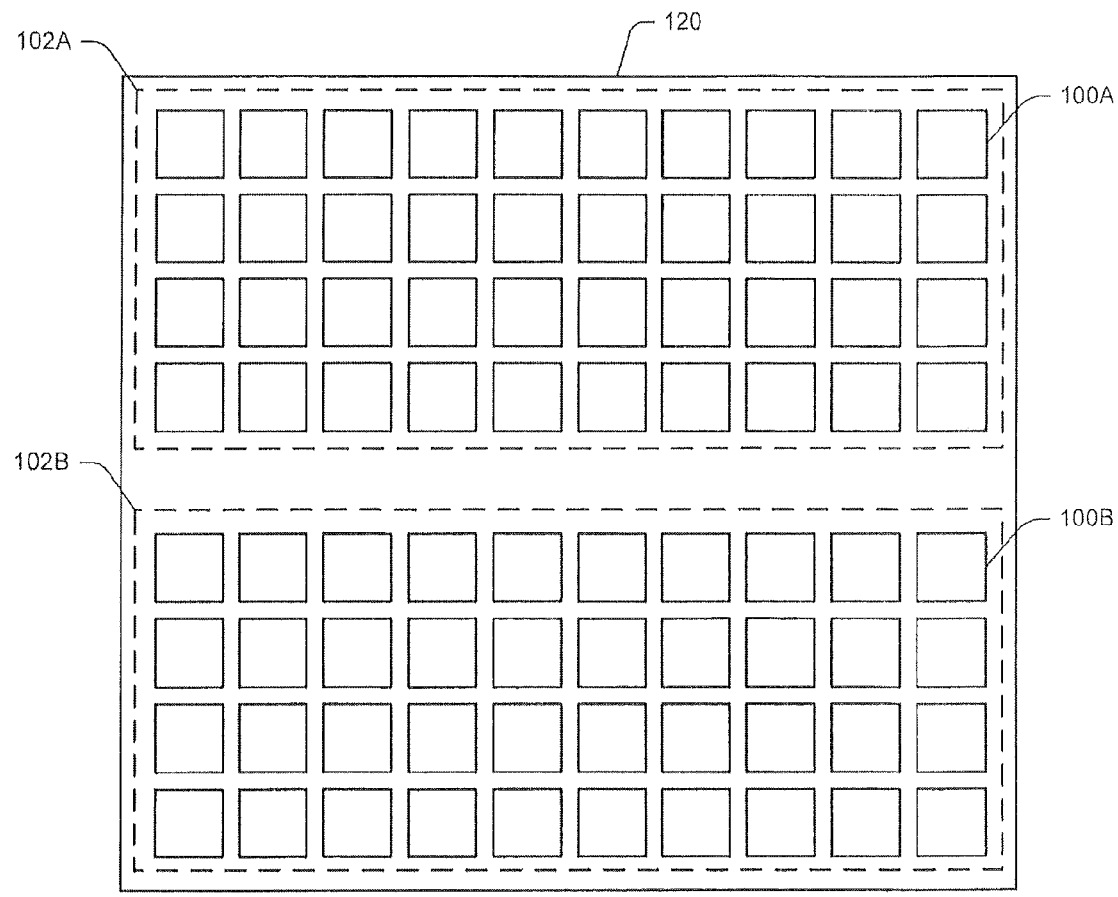
FIG. 1 is a schematic top view illustrating a bonding surface and multiple semiconductor devices attached thereto according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Some embodiments of the present invention relate to application of an optical material to an optical element that is mounted on a substrate. The optical element may include a semiconductor light emitting device.

Various embodiments of the present invention for manufacturing and/or packaging a light emitter such as a semiconductor light emitting device will be described herein. As used herein, the term semiconductor light emitting device may include a light emitting diode (LED), laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1. Furthermore, the present invention may be suitable for use with light emitting devices and methods therefore, such as those described in U.S. Pat. Nos. 7,326,583, 7,442,564, 7,521,728 and 7,646,035, the disclosures of which are incorporated by reference as if set forth fully herein.

Optical materials may include wavelength converting materials, luminescent materials, scattering particles, and/or light filters, among others. Particles as discussed herein may include small and/or large diameter particles. For example, some embodiments provide that small particles can be about 5 microns or less mean diameter particle size and can include nanoparticles. Large diameter particles can include about 15 microns or greater mean diameter size, such as, for example, 17 microns or greater.

Particles, such as phosphor particles, may be included and/or suspended in a coating that may be conformally applied to and/or deposited on a semiconductor device such as, for example, an LED chip. In some embodiments, the conformal coating may be applied by spraying, dipping and/or by a mechanical application device including a brush, roll and/or stamp, among others.

The amount of phosphor particles deposited on an LED may impact the emission performance of the device. In this regard, applying a conformal coating may provide more consistent emission performance.

As used herein, the term "conformal coating" may include a coating that has the same or different thicknesses on surfaces having different orientations. For example, a conformal coating thickness on a top surface may be different than a conformal coating on a side surface. Additionally, conformal coating thicknesses may not be uniform on any of the coated surfaces. In some embodiments, the thickness variations may be intentionally configured to correspond to particular emission characteristics of an LED having a specific geometry and/or may be a result of a coating method that is employed, while still yielding an acceptable result. Some embodiments provide that the coatings may include a surface roughness with agglomerated particles that may create local thickness variation. In some embodiments, other geometries on an LED, such as three-dimensional light extraction features, may become more planar after the conformal coating is applied, depending on the size and thickness of the geometry.

Reference is now made to FIG. 1, which is a schematic top view illustrating a bonding surface and multiple semiconductor devices attached thereto according to some embodiments of the present invention. As described herein, semiconductor devices may include light emitters including, for example, LEDs 100. The LEDs 100 may arranged on a bonding surface 120 proximate one another in at least one direction. For example, as illustrated in FIG. 1, the LEDs 100 are arranged on the bonding surface 120 in a two-dimensional array. In some embodiments, the LEDs 100 may be arranged on the bonding surface 120 with a substantially consistent space between adjacent ones of the LEDs 100. Some embodiments provide that the space may be in a range between 50 and 250 µm, although closer together and/or farther apart may be possible. In some embodiments, the LEDs 100 may be spaced apart a first distance in a first direction and a second distance in a second direction that is different from the first direction.

In some embodiments, the LEDs 100 may be placed on the bonding surface 120 according to previously determined emission characteristics. Some embodiments provide that the LEDs 100 are grouped into different groups and/or bins according to emission characteristics, such as, for example, color temperature, chromaticity, and/or luminance, among others. In this regard, different zones 102A, 102B of the bonding surface 120 may be defined such that LEDs 100 corresponding to specific groups and/or bins may be placed in specific zones 102A, 102B and the location of the LEDs 100 on the bonding surface 120 may be mapped according to LED emission characteristics. For example a first group of LEDs 100A that exhibit a first emission characteristic may be arranged in a first zone 102A on the bonding surface 120 and a second group of LEDs 100B may be arranged in a second zone 102B on the bonding surface 120. Some embodiments provide that the groups of LEDs 100 are sorted into groups corresponding to narrow wavelength ranges such as ranges from about 2.0 nm to about 3.0 nm. In some embodiments, the groups may be sorted in wavelength ranges of about 2.5 nm.

Once the LEDs 100 are grouped according to emission characteristics, different conformal coatings and/or combinations thereof may be designated corresponding to the different LED emission characteristics. For example, different conformal coatings may include different combinations of light conversion materials, different quantities of layers, and/or different layer thicknesses, among others. In this manner, an increase in the overall uniformity of the emission characteristics of the groups of LEDs 100 may be improved.

Figure 2A:
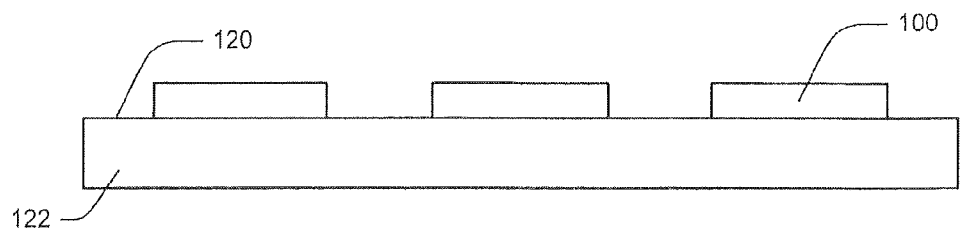
FIGS. 2A-2D are schematic side cross-sectional views illustrating multiple semiconductors after respective operations for providing conformally coated semiconductor devices according to some embodiments of the present invention.

Reference is now made to FIGS. 2A-2D, which are schematic side cross-sectional views illustrating multiple semiconductors after respective operations for providing conformally coated semiconductor devices according to some embodiments of the present invention. Referring to FIG. 2A, multiple LEDs 100 may be arranged proximate one another on a bonding surface 120. Some embodiments provide that the bonding surface 120 may include a surface of a bonding media 122. In some embodiments, the bonding media 122 may be a temporary bonding media that is operable to maintain the positions and/or arrangement of the LEDs 100 relative to one another during subsequent processing operations.

In some embodiments, the bonding media 122 may include a high temperature tape and/or other flexible material that may include and/or be supplemented with a bonding material. Some embodiments provide that the LEDs 100 may be sorted directly to the bonding media 122. In some embodiments, the LEDs 100 may be arranged with a thin frame therebetween in a high density arrangement. The LEDs 100 may be arranged as a sorted die sheet wherein ones of the LEDs 100 having similar emission characteristics are arranged together in a tightly packed array. The LEDS 100 may then be transferred from the sorted die sheet to the bonding media 122.

Figure 2B:
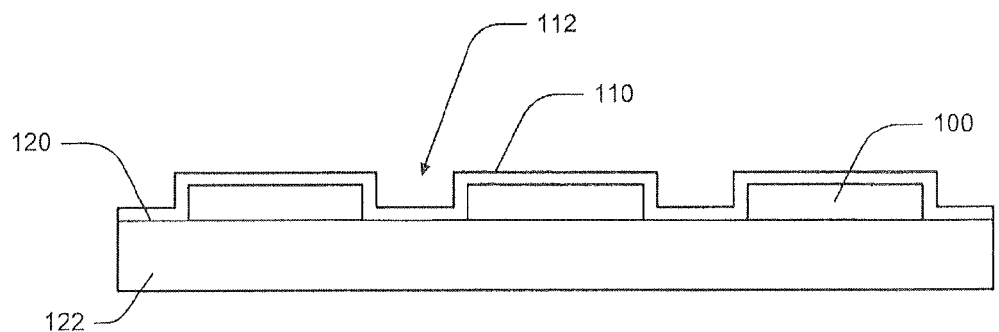

Referring now to FIG. 2B, a conformal coating 110 is applied to the multiple LEDs 100 that are arranged on the bonding surface 120. The conformal coating 110 is applied to form a coating over the multiple LEDs 100 and the gaps 112 between adjacent ones of the multiple LEDs 100. The conformal coating 110 may include, for example, optical materials that are operable to modify and/or convert light emitted from the LEDs 100. The conformal coating 110 may be applied to a large number of LEDs 100 in a batch operation using, contact coating and/or spraying methods, among others. The present invention may be suitable for use with phosphor coating systems and methods therefore, such as those described in U.S. patent application Ser. No. 12/014,404 filed Jan. 15, 2008, the disclosure of which is incorporated by reference as if set forth fully herein. For example, a carrier liquid containing optical materials may be conveyed to a spray nozzle (not shown). The carrier liquid is sprayed onto the LEDs 100 via the spray nozzle. In particular, pressurized gas supplied to the spray nozzle through a high pressure gas supply line (not shown) may atomize the carrier liquid and direct the optical materials towards the LEDs 100 where the optical materials are conformally deposited. Although illustrated as a single conformal coating 110, the conformal coating 110 may include multiple layers of conformal coatings that may include the same and/or different compositions of optical materials.

In some embodiments, operations corresponding to applying the conformal coating 110 may result in temperatures greater than about 150° C. For example, operations, such as those described in U.S. Patent Publication No. 2010/0155763 A1, entitled Systems And Methods For Application Of Optical Materials To Optical Elements, the disclosure of which is incorporated by reference herein as if set forth fully, may also be suitable for use in embodiments of the present invention. Before the conformal coating 110 is applied, the LEDs 100 may be heated using any of a variety of heating devices and/or heating technologies. In some embodiments, a first heating device may provide an initial heating of the optical element and then a second heating device may provide a maintenance heating operation. In some embodiments, the LEDs 100 may be heated to a temperature in a range of about 90 degrees Celsius to about 155 degrees Celsius.

Some embodiments provide that optical materials may be applied onto the heated LEDs 100 to provide a conformal coating layer that is included in the conformal coating 110. Some embodiments provide that the optical materials may be applied suspended in a luminescent solution that may be atomized using a flow of pressurized gas. The atomized luminescent solution may be sprayed onto the heated LEDs 100 using the flow of pressurized gas. For example, the optical material may include wavelength conversion particles suspended in a solution including a volatile solvent and a binder material. Some embodiments provide that the volatile liquid is evaporated via thermal energy in the heated LEDs 100. In this manner a conformal layer of wavelength conversion particles may be provided on the LEDs 100 to form the conformal coating 110. Some embodiments provide that the solution includes a nonvolatile liquid. In such embodiments, the nonvolatile liquid may be cured via the thermal energy in the heated LEDs 100.

Some embodiments provide that the conformal coating 110 may be cured and/or further cured after the optical materials are applied by heating the conformally coated LEDs 100 for a given time period in a post-application curing operation. In some embodiments, the conformally coated LEDs 100 may be heated to a temperature of about 150 degrees Celsius for a given time, although 150 degrees Celsius is provided as a non-limiting example and other temperatures are contemplated herein. Some embodiments provide that the given time may be about 1 hour, although this given time is provided by way of non-limiting example. A post-application operation may be performed in addition to and/or as an alternative to heating the LEDs 100 prior to applying materials corresponding to the conformal coating 110.

In this regard, some embodiments provide that the bonding between the bonding surface 120 and the LEDs 100 remains functional to temperatures of at least 150° C. Some embodiments provide that additional structural support may be provided to the bonding media 122 during the coating operations to reduce thermally induced distortion of the bonding media 122. For example, a vacuum chuck (not shown) may be used to support the bonding media 122 during the coating operation(s).

Figure 2C:
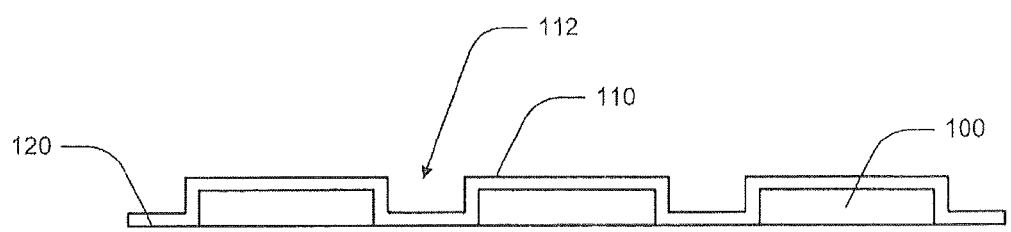

Referring to FIG. 2C, once the conformal coating 110 is cured, the LEDs 100 may be removed from the bonding surface 120 before singulation into separate LEDs 100 that may be used individually. In some embodiments, the conformal coating 110 that is in the gap 112 between adjacent ones of the LEDs 100 may be etched, scribed and/or formed to include a designated fracture line for separating the LEDs 100.

Some embodiments provide that the bonding media 122 includes an elastic property such that it can be deformed and/or stretched at a greater rate than the LEDs 100 and/or the conformal coating 110. In such embodiments, before the LEDs 100 are removed from the bonding surface 120, the bonding media 122 may be manipulated to cause the separation of the LEDs 100 from one another. For example, the bonding media 122 may be stretched to provide a separating force between adjacent ones of the LEDs 100. In some embodiments, the bonding media 122 may be deplanarized to provide a separating force between adjacent ones of the LEDs 100. For example, the bonding media 122 may be deformed over one or more rollers oriented in one or more directions relative to the bonding media to provide a separating force between adjacent ones of the plurality of LEDs 100.

Figure 2D:
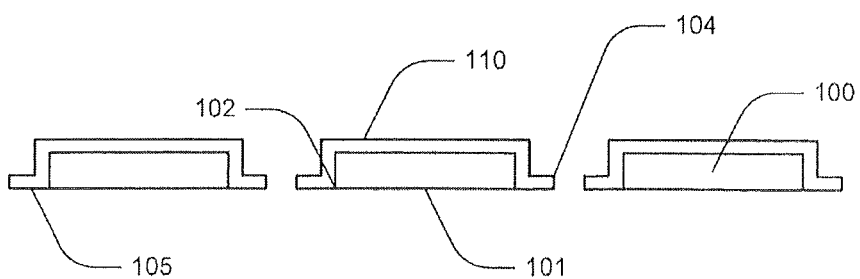

Referring to FIG. 2D, the multiple LEDs 100 may be separated for individual use. Some embodiments provide that the LEDs 100 may be separated by mechanically breaking the conformal coating 110 that is in the gap 112 that is between the LEDs 100. Some embodiments provide that the LEDs 100 may be separated by cutting the conformal coating 110 in the gap 112 that is between the LEDs 100. For example, a sawing device (not shown) may be used to separate the LEDs 100 from one another.

Once separated, each conformally coated LED 100 may include a conformal coating ledge 104 that extends from the base 102 of the LED 100 and that may have a bottom surface 105 that is substantially coplanar with the bottom surface 101 of the LED 100.

In this regard, embodiments herein include an LED 100 that includes a conformal coating 110 that includes a conformal coating ledge portion 104 that extends from the base 102 of the LED 100. Some embodiments provide that the conformal coating ledge portion 104 may include a thickness in a range from about 30 μm to about 100 μm, which may correspond to a thickness range of the conformal coating 110. In some embodiments, the conformal coating ledge portion 104 may be referred to as a conformal coating wing. As illustrated, the LED 100 may include a first surface and at least one side surface on which the conformal coating may be applied. The LED 100 may include a second surface that is substantially opposite the first surface. The conformal coating ledge 104 may extend from a base 102 on a side surface of the LED 100 out from the LED 100. Some embodiments provide that at least one side of the conformal coating ledge 104 may be substantially parallel with the second side of the LED 100.

In some embodiments, wherein the conformal coating 110 includes multiple layers of conformal coatings that may be applied separately. For example, the conformal coating 110 may include a first conformal coating that is applied to the LED and a second conformal coating that is applied to the first conformal coating. Some embodiments provide that the first and second conformal coatings each include light conversion particles that are configured to convert a portion of light received from the LED. Some embodiments provide that the first and second conformal coatings include light conversion particles including different light conversion particles from one another.

Reference is now made to FIGS. 3A-3D, which are schematic side cross-sectional views illustrating multiple semiconductors including top-surface electrically conductive contacts after respective operations for providing conformally coated semiconductor devices including top-surface electrically conductive contacts according to some embodiments of the present invention. As discussed above regarding FIG. 2A, multiple LEDs 100 may be arranged proximate one another on a bonding surface 120 of a bonding media 122. An LED 100 of FIG. 3A may include at least one conductive portion 130 on the top side of the LED 100 that is opposite the bottom side that is proximate the bonding surface 120. The conductive portions 130 may include solder bump bonds and/or wirebond conductors among others. In some embodiments, the conductive portions 130 may include patterned metal features such as, for example, a die attach pad, a wire bond pad, and/or electrodes, among others.

Similar to the description regarding FIG. 2B, a conformal coating 110 is applied to the multiple LEDs 100 that are arranged on the bonding surface 120. The conformal coating 110 is applied to form a coating over the multiple LEDs 100 including the conductive portions 130 and the gaps 112 between adjacent ones of the multiple LEDs 100.

Figure 3A:
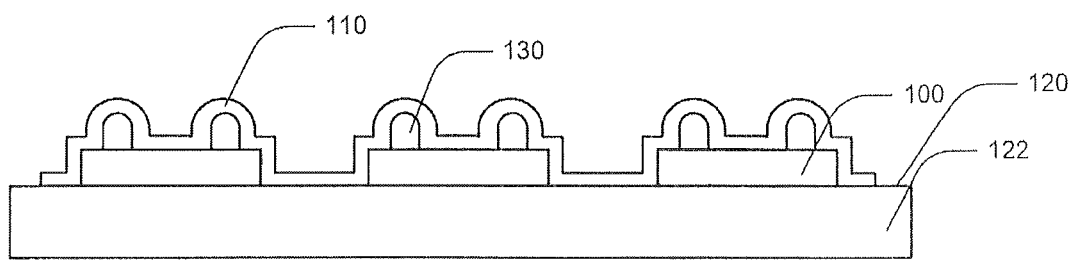
FIGS. 3A-3D are schematic side cross-sectional views illustrating multiple semiconductors including top-surface electrically conductive contacts after respective operations for providing conformally coated semiconductor devices including top-surface electrically conductive contacts according to some embodiments of the present invention.
Figure 3B:
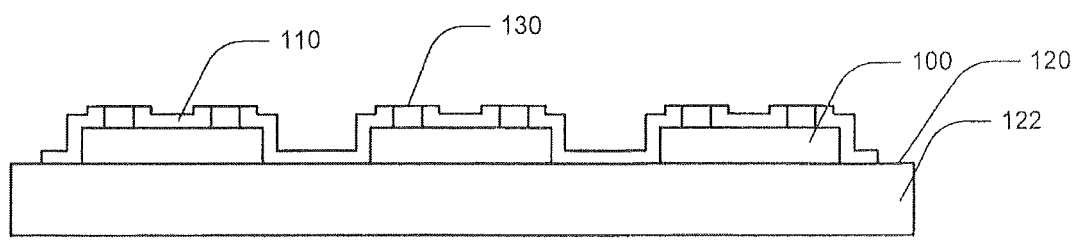

Referring to FIG. 3B, a portion of the conformal coating 110 that covers the conductive portions 130 may be removed. Some embodiments provide that removing the portion of the conformal coating 110 may be removed via abrasion, etching, and/or chemical-mechanical polishing (CMP), among others. In some embodiments, a portion of the conductive portion 130 may also be removed. Some embodiments provide that the quantity of conformal coating 110 and/or the conductive portions 130 that are removed results in conductive contacts 130 that are substantially coplanar with the conformal coating 130 that remains on the top surface of the LEDs 100. In some embodiments, the quantity of conformal coating 110 and/or the conductive portions 130 that are removed results in conductive contacts 130 that extend above a plane corresponding to the conformal coating 130 that remains on the top surface of the LEDs 100.

Figure 3C:
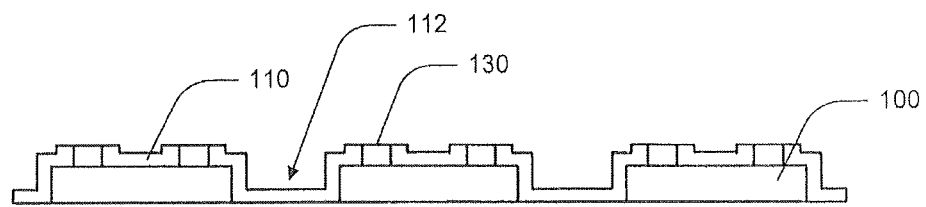
Figure 3D:
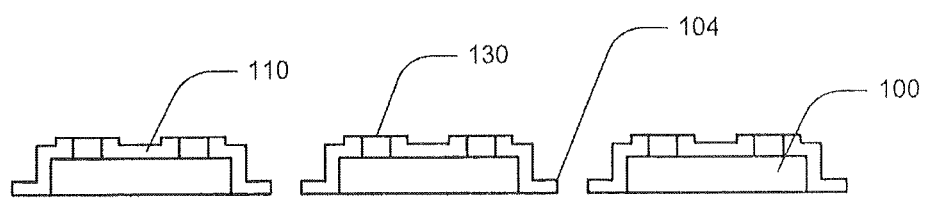

Referring to FIGS. 3C and 3D, the LEDs 100 may be removed from the bonding surface 120 and separated from one another into conformally coated LEDs 100 that may be used individually. As discussed above regarding FIGS. 2C and 2D, some embodiments provide that the LEDs 100 may be separated from one another before being removed from the bonding surface 120. Once separated and removed from the bonding surface 120, each conformally coated LED 100 may include a conformal coating ledge 104 that extends from the base 102 of the LED 100 and at least one conductive portion 130 on the top of the LED 100.

Figure 4:
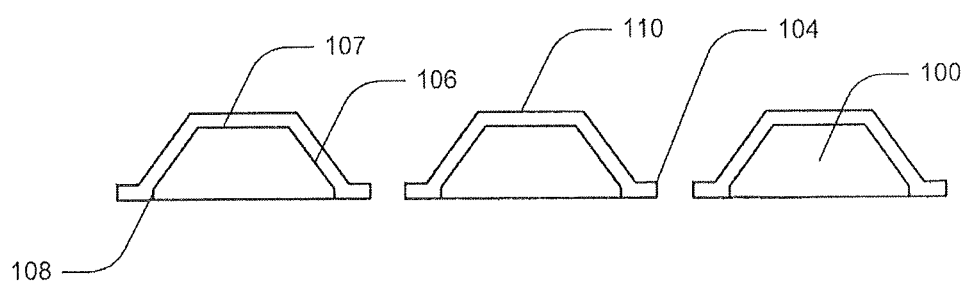
FIG. 4 is a schematic side cross-sectional view illustrating multiple conformally coated semiconductor devices according to some embodiments of the present invention.

Brief reference is now made to FIG. 4, which is a schematic side cross-sectional view illustrating multiple conformally coated semiconductor devices according to some embodiments of the present invention. As illustrated, the LEDs 100 may include shapes and/or surfaces other than the substantially planar top surfaces as described above. For example, the LEDs 100 may include a transitional surface 106 that defines a transition from a top surface 107 to a side surface 108. Other shapes and/or geometries are contemplated within the scope of this disclosure as well.

Figure 5:
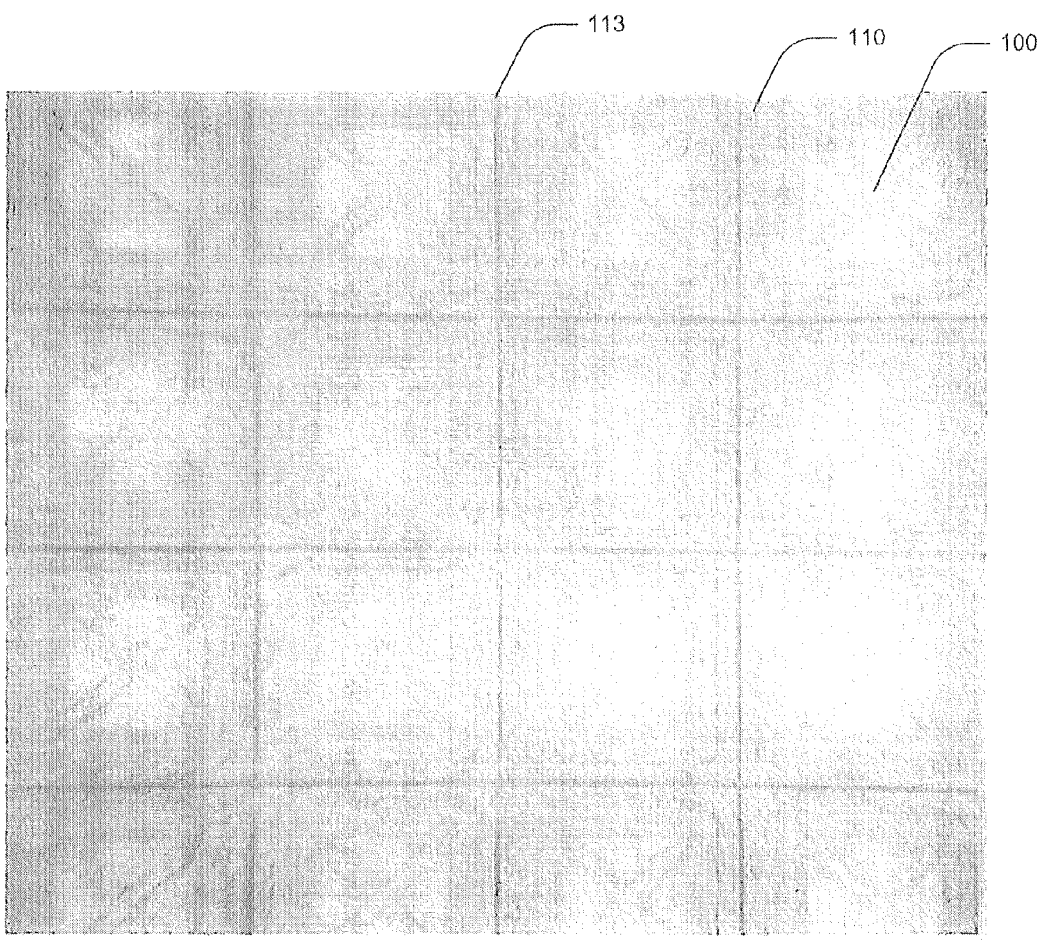
FIG. 5 is a magnified photograph illustrating multiple semiconductor devices arranged according to some embodiments of the present invention.
Figure 6:
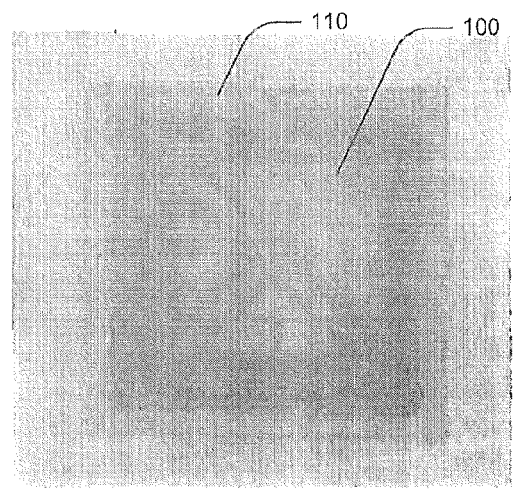
FIG. 6 is a magnified photograph illustrating a single one of the multiple semiconductor devices in the photograph in FIG. 5 according to some embodiments of the present invention.

Brief reference is now made to FIG. 5, which is a magnified photograph illustrating multiple semiconductor devices arranged according to some embodiments of the present invention. The magnified photograph depicts a plurality of LEDs 100 arranged adjacent one another and including a conformal coating 110 that is formed on the LEDs 100. The LEDs 100 are separated from one another by linear cuts 113 made by a saw applied therebetween. Similarly, referring to FIG. 6, a magnified photograph illustrates a single one of the multiple semiconductor devices in the photograph of FIG. 5.

Figure 7A:
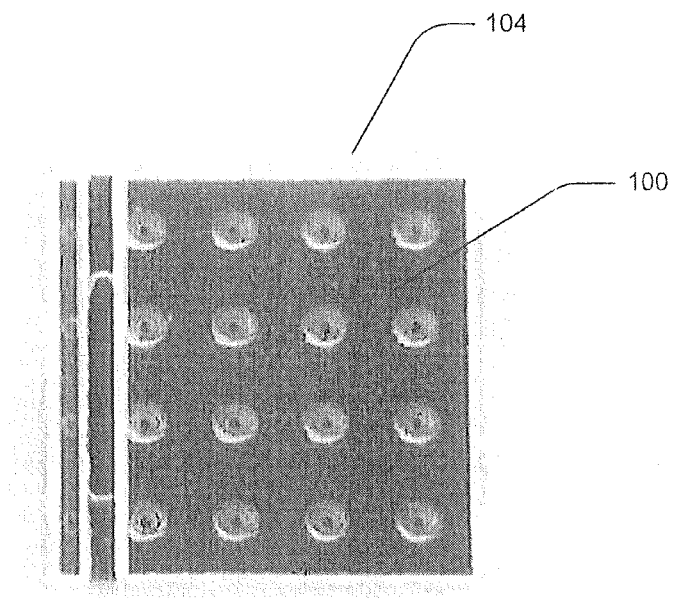
FIGS. 7A-7B are magnified photographs illustrating top and perspective views, respectively, of a conformally coated semiconductor device that is separated from other ones of the multiple semiconductor devices according to some embodiments of the present invention.
Figure 7B:
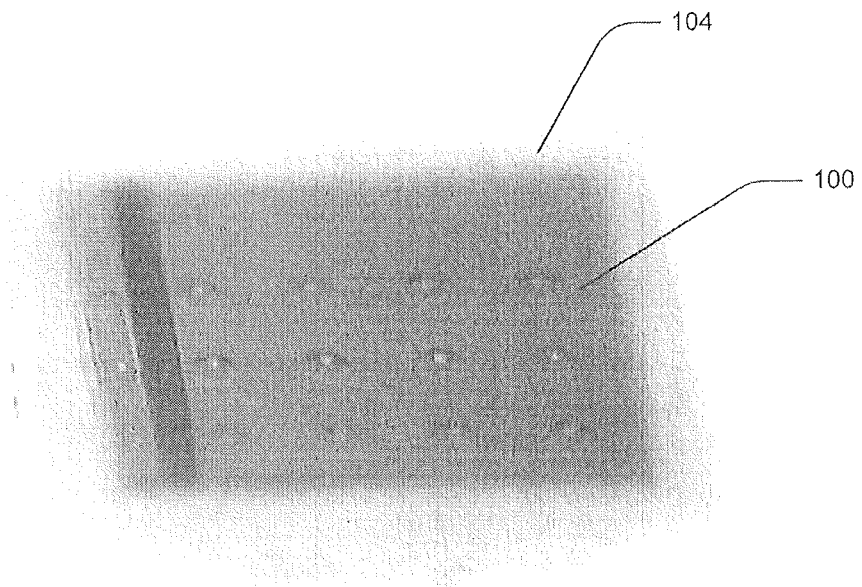

Brief reference is now made to FIGS. 7A-7B, which are magnified photographs illustrating top and perspective views, respectively, of a conformally coated semiconductor device that is separated from other ones of the multiple semiconductor devices according to some embodiments of the present invention. As depicted, the conformally coated LED 100 includes a conformal coating ledge 104 that extends from the side edge of the LED 100 around the periphery thereof.

Figure 8:
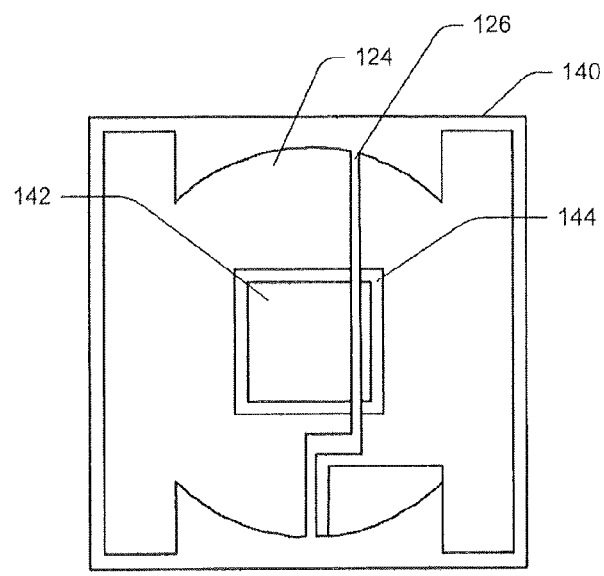
FIG. 8 is schematic top view illustrating a substrate for mounting a semiconductor device according to some embodiments of the present invention.

Reference is now made to FIG. 8, which is schematic top view illustrating a substrate for mounting a semiconductor device according to some embodiments of the present invention. The substrate 140 includes the mounting portion 142. Some embodiments provide that the mounting portion 142 is surrounded by a relief portion 144, which may include a trench formed in the substrate. The substrate 140 may further include one or more metalized surfaces 124 and one or more isolation channels 126 that may be formed therein.

Figure 9:
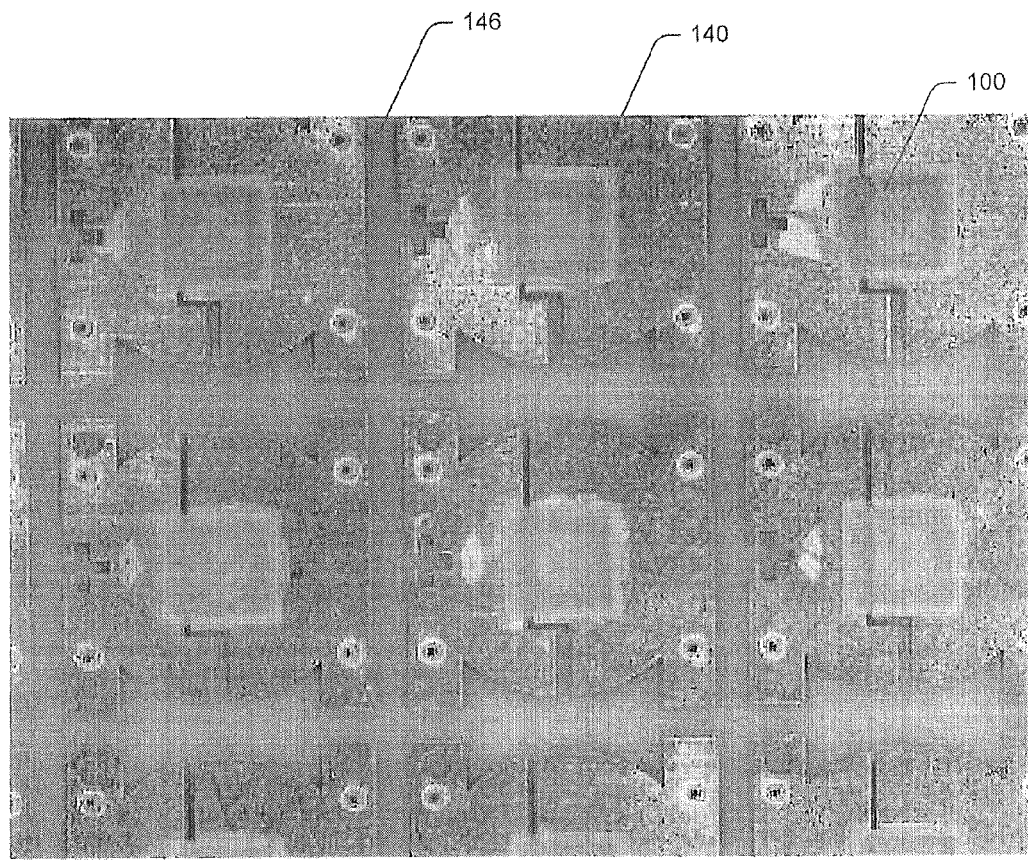
FIG. 9 is a magnified photograph illustrating a top view of a wafer including multiple substrates and conformally coated semiconductor devices according to some embodiments of the present invention mounted thereon.
Figure 10:
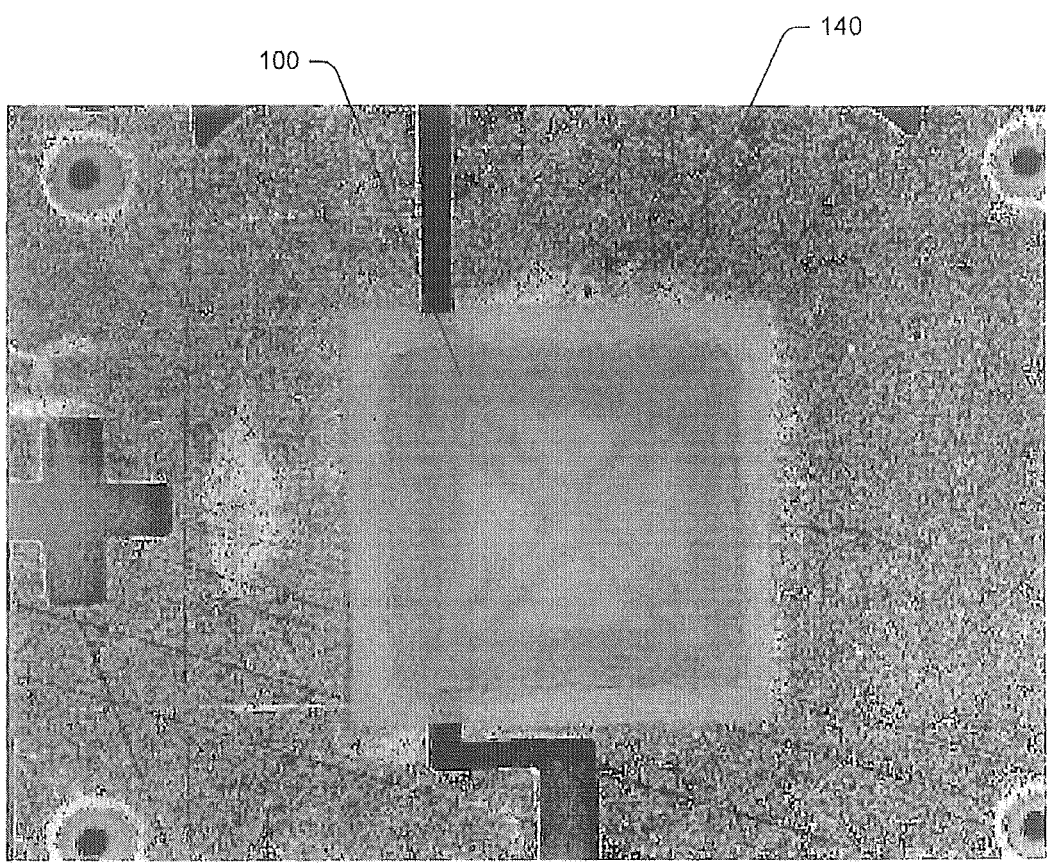
FIG. 10 is a magnified photograph illustrating a top view of a conformally coated semiconductor device mounted on a wafer including multiple substrates according to some embodiments of the present invention.

Brief reference is now made to FIG. 9, which is a magnified photograph illustrating a top view of a wafer including multiple substrates and conformally coated semiconductor devices according to some embodiments of the present invention. Some embodiments provide that multiple regions are provided on the wafer 146 corresponding to multiple substrates 140. As photographed, conformally coated LEDs 100 are formed on each of the regions corresponding to the multiple substrates 140. Additionally, referring to FIG. 10, a magnified photograph depicts a top view of one of the conformally coated semiconductor devices 100 mounted a substrate 140 on the wafer of FIG. 9.

Figure 11:
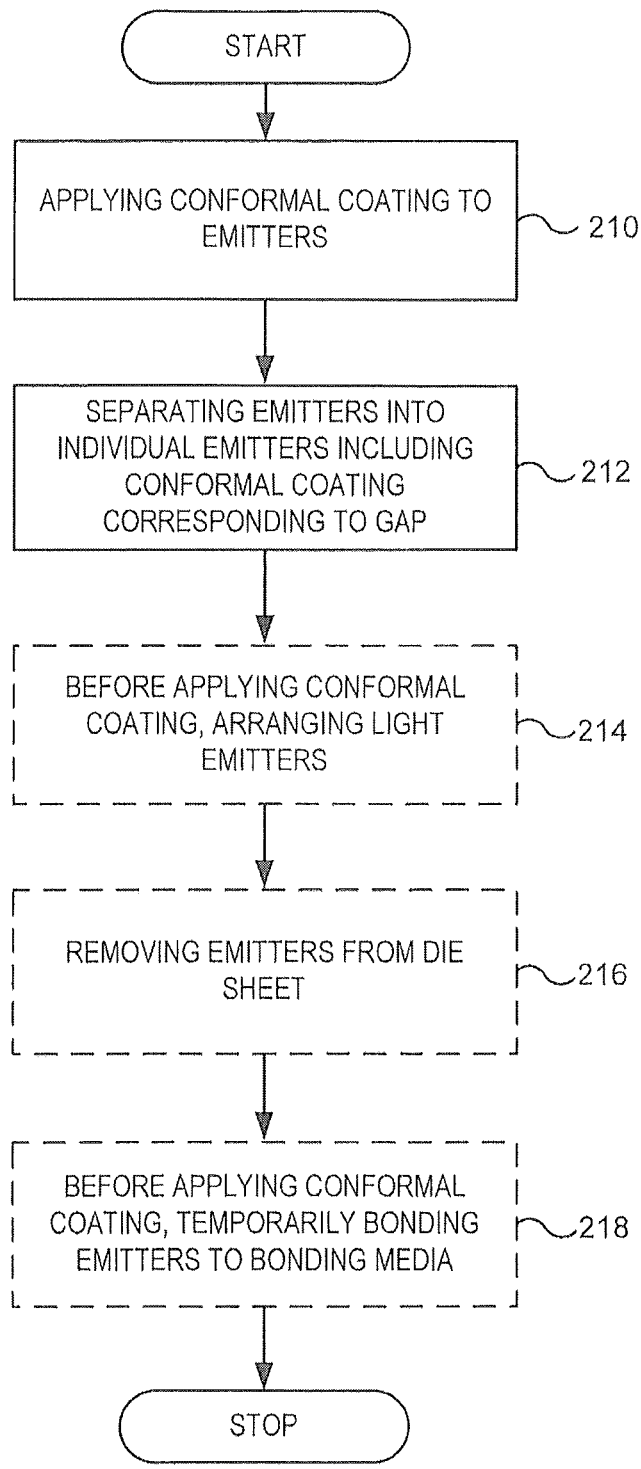
FIG. 11 is a flow chart illustrating operations for providing a conformally coated semiconductor device according to some embodiments of the present invention.

Reference is now made to FIG. 11, which is a flow chart illustrating operations for providing a conformally coated semiconductor device according to some embodiments of the present invention. Operations may include applying a conformal coating to multiple light emitters, such as LEDs (block 210). The conformal coating may be formed in gap areas between adjacent ones of the light emitters. In some embodiments, the conformal coating may be applied in more than one layer. Each of the multiple layers may include the same and/or different optical materials that include the same and/or different respective light conversion properties.

In some embodiments, the light emitters may include at least one wirebond conductor. In such embodiments, before applying the conformal coating, the wirebond conductor(s) may be masked so that the conformal coating is not formed thereon.

Some embodiments provide that the light emitters may include at least one solder bump bond. After applying the conformal coating to the light emitters, a portion of the conformal coating may be removed from the solder bump bond(s) to expose a conductive surface. In some embodiments, a portion of the solder bump bond may be removed in the process of removing the portion of the conformal coating.

Operations may include separating the light emitters into individual conformally coated light emitters (block 212). As described above, the conformal coating may extend into a space corresponding to gap areas between the light emitters. Once separated, the conformal coating may include a conformal coating ledge that extends from the sides of the light emitter. Some embodiments provide that separating the light emitters includes mechanically breaking the conformal coating that is in the respective gap areas between ones of the light emitters.

In some embodiments, a wire grid may be provided between adjacent ones of the light emitters before the conformal coating is applied. The wire grid may include and/or be treated with a release agent, such as, for example, a mold release, so that the conformal coating does not adhere thereto. Once the conformal coating is applied, the wireform may be removed. In this manner, the light emitters may be substantially separated from one another. Some embodiments provide that separating the light emitters includes cutting the conformal coating that is in the respective gap areas between the ones of the light emitters. For example, a sawing device may be used to cut lines in the conformal coating between the light emitters.

In some embodiments the light emitters are arranged proximate one another before applying the conformal coating to the light emitters (block 214). For example, the light emitters may be arranged to be adjacent one another in one or more directions. In some embodiments, the light emitters are arranged in a two-dimensional array and may be grouped corresponding to relative emission characteristics of the ones of the plurality of light emitters. In this manner, light emitters may be arranged in a two-dimensional array that groups light emitters having similar emission characteristics together. For example, light emitters including a first emission characteristic may be grouped together in a first group and light emitters having a second different emission characteristic may be grouped into a second group that arranged to be in a different portion of the array. Some embodiments provide that the emission characteristics may be defined in terms of chromaticity bins, among others.

Some embodiments provide that the light emitters are attached to a die sheet that is operable to support the light emitters while the conformal coating is applied. In some embodiments, the light emitters may be arranged using the sorted die sheet and then transferred to a bonding surface for application of the conformal coating.

The conformal coating may be applied in a first thickness to the first group of light emitters and a second thickness that is different from the first thickness to the second group of light emitters. In some embodiments, the different thicknesses may be applied using different respective quantities of layers of conformal coating.

Some embodiments provide that a first conformal coating having first light conversion properties is applied to the first group of light emitters and a second conformal coating having second different light conversion properties is applied to the second group of light emitters. By providing different thicknesses and/or coating materials to light emitters having different emission characteristics, conformally coated light emitters may realize increased uniformity in emission characteristics. Some embodiments provide that the composition of different thicknesses and/or layers of conformal coating may be determined with and/or without intervening measurement of emission characteristics. The present invention may be suitable for use with devices and methods such as those described in U.S. Patent Publication No. 2003/0089918, the disclosure of which is incorporated by reference as if set forth fully herein.

After the conformal coating is applied, the light emitters are removed from the die sheet (block 216). Some embodiments provide that the light emitters are separated from one another prior to being removed from the die sheet. In some embodiments, the light emitters are removed from the die sheet before they are separated into individual light emitters. For example, the light emitters may be temporarily bonded to a bonding media before applying the conformal coating thereto (block 218).

In some embodiments, the bonding media includes an adhesive bonding material and a support material that are operable to maintain a bond to the light emitters at temperatures corresponding to subsequent processing operations. For example, the bonding and support material may be functional at temperatures of at least 150° C. Some embodiments provide that the bonding media includes a high temperature tape that is operable to bond the light emitters through temperatures greater than 150° C.

Figure 12:
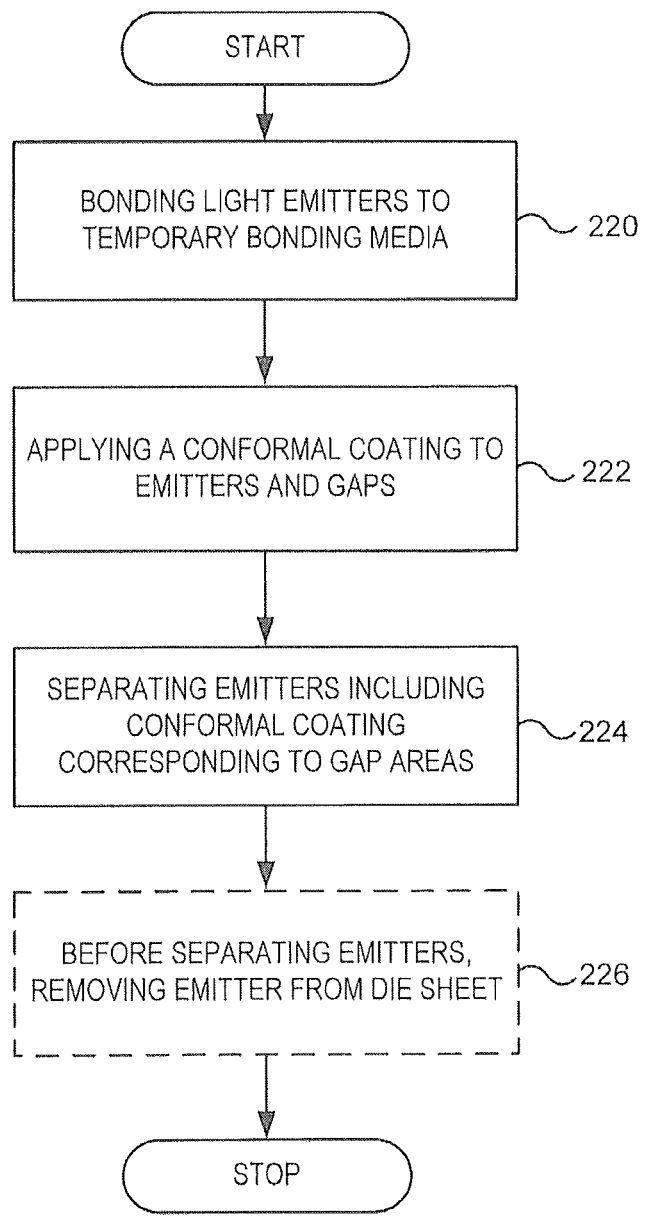
FIG. 12 is a flow chart illustrating operations for providing a conformally coated semiconductor device according to some embodiments of the present invention.

Reference is now made to FIG. 12, which is a flow chart illustrating operations for providing a conformally coated semiconductor device according to some embodiments of the present invention. Operations include bonding multiple light emitters to a temporary bonding media (block 220). Some embodiments provide that the temporary bonding media is operable to maintain a bond to the emitters at temperatures of at least 150° C. In some embodiments, the bonded light emitters are arranged proximate one another based on relative emission characteristics. Some embodiments provide that the light emitters are arranged on a die sheet that may support the light emitters in a two-dimensional array that groups light emitters having similar emission characteristics together.

Operations may include applying a conformal coating to the light emitters and the gap areas between adjacent ones of the light emitters (block 222). According to some embodiments, the conformal coating includes optical materials that may be sprayed onto the light emitters. Some embodiments provide that the conformal coating is applied using application techniques such as pouring, dipping, rolling, brushing and/or stamping, among others. The optical material may include wavelength conversion particles suspended in a solution including a volatile solvent and a binder material. Some embodiments provide that the volatile liquid is evaporated via, for example, thermal energy. Some embodiments provide that the solution includes a nonvolatile liquid that may be cured via, for example, thermal energy.

Where a first group of light emitters has first light emission characteristics and a second group of light emitters has second emission characteristics, the conformal coating may be selectively applied thereto. For example, some embodiments include applying a first thickness of the conformal coating to the first group of light emitters and a second thickness of the conformal coating to the second group of light emitters. In this manner, the difference in emission characteristics between the first and second groups of light emitters may be reduced by the difference in the thickness of the conformal coating applied thereto. Additionally, some embodiments include applying a first conformal coating that has first light conversion properties to some or all of the light emitters and then applying a second conformal coating that has second different light conversion properties to some or all of the light emitters.

Some embodiments provide that a first conformal coating having first light conversion properties may be applied to the first group of light emitters and a second conformal coating having second different light conversion properties may be applied to the second group of light emitters. In some embodiments, the conformal coating may be multiple layers of conformal coatings that may be different and/or substantially the same in thickness and/or composition. For example, different combinations of thickness and/or composition of conformal coatings may be applied to different groups of light emitters. Although first and second groups of light emitters are discussed herein by way of example, operations as disclosed herein may be applied to more than two groups of light emitters. Further, some embodiments provide that the light emitters are not arranged in groups and may be processed similarly as batches.

Operations may include separating the light emitters into individual conformally coated light emitters that include the conformal coating that extends to a space corresponding to respective gap areas (block 224). For example, conformal coating ledges may be formed around the sides of the individual light emitters. Some embodiments provide that the light emitters may be separated by mechanically breaking the conformal coating that is in the respective gap areas between ones of the light emitters. In some embodiments, the light emitters may be separated by cutting the conformal coating that is in the respective gap areas between the ones of the plurality of light emitters. Some embodiments provide that the light emitters may be removed from the die sheet and/or bonding surface before the light emitters are separated from one another (block 226).

Figure 13:
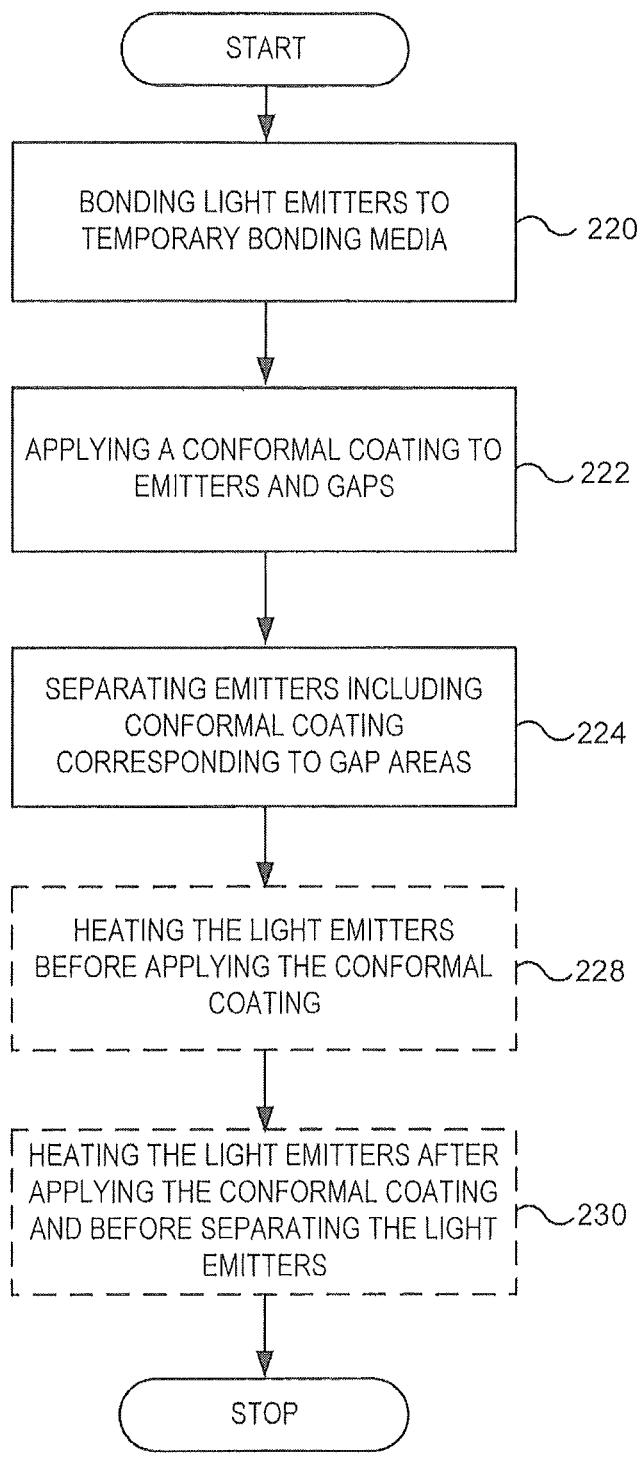
FIG. 13 is a flow chart illustrating operations for providing a conformally coated semiconductor device according to some embodiments of the present invention.

Reference is now made to FIG. 13, which is a flow chart illustrating operations for providing a conformally coated semiconductor device according to some embodiments of the present invention. Operations corresponding to blocks 220, 224 and 226 are discussed above with reference to FIG. 12, a redundant discussion of which will not be provided. Some embodiments provide that before the conformal coating is applied, the light emitters are heated (block 228). By heating the light emitters before applying the conformal coating, the conformal coating may cure via thermal energy in the light emitters.

In some embodiments, after the conformal coating is applied and before the light emitters are separated, the light emitters may be heated to a given temperature for a given time (block 230). Some embodiments provide that the conformally coated light emitters may be heated to a temperature in a range of about 90 degrees Celsius to about 155 degrees Celsius. In some embodiments, the conformally coated light emitters may be heated for a given number of minutes and/or hours. In a non-limiting example, the conformally coated light emitters may be heated for about one hour. Some embodiments provide that heating the light emitters before applying the conformal coating and heating the conformally coated light emitters may be performed alternatively and/or in conjunction with one another.

Figure 14A:
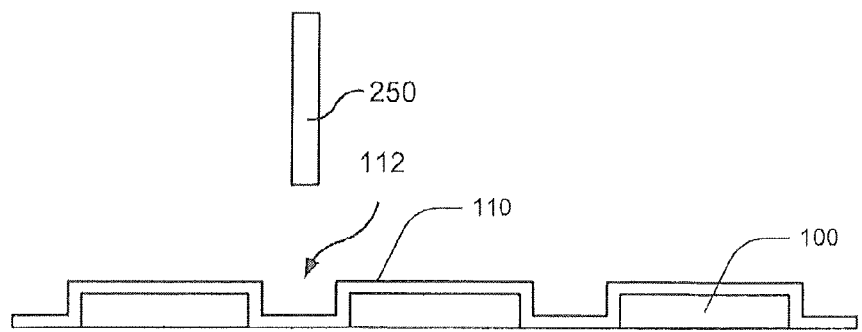
FIGS. 14A and 14B are cross sectional views illustrating the dicing of conformally coated light emitting diode structures according to some embodiments of the invention.
Figure 14B:
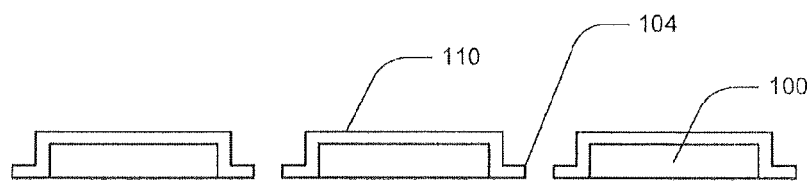

Reference is now made to FIGS. 14A and 14B, which are cross sectional views illustrating the dicing of conformally coated light emitting diode structures according to some embodiments of the invention. As shown therein, multiple light emitters 100 may include a conformal coating 110 thereon. Some embodiments provide that the light emitters 100 are conformally coated on a die sheet and/or bonding surface, from which the light emitters 100 are removed before separation. Regions or gaps 112 between the light emitters 100, may correspond to saw streets that may be formed in the conformal coating 110. A separating structure 250 may be applied to the conformal coating 110 in the gaps 112 between the light emitters 100. Referring to FIG. 14B, the conformally coated individual light emitters 100 may include a conformal coating ledge 104 that extends from the sides of the light emitters 100.

Figure 15:
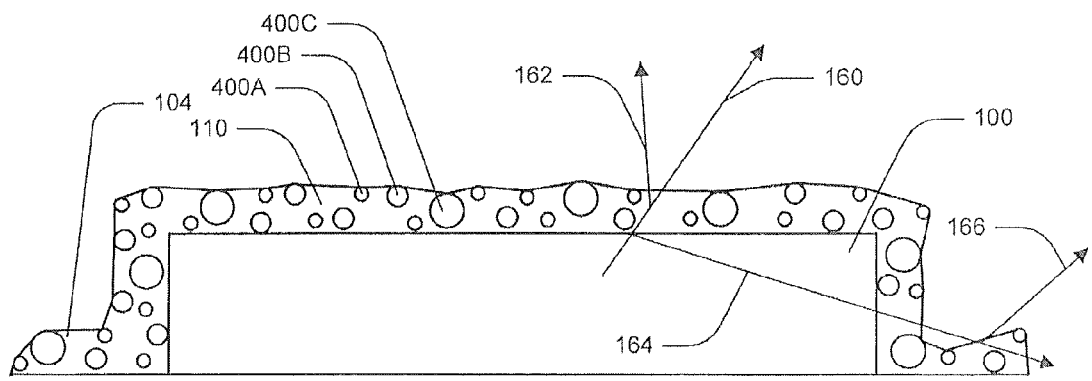
FIG. 15 is a schematic side cross-sectional view illustrating a conformally coated semiconductor device and circulating light conversion of light emitted therefrom according to some embodiments of the present invention.

Reference is now made to FIG. 15, which is a schematic side cross-sectional view illustrating a conformally coated semiconductor device and circulating light conversion of light emitted therefrom according to some embodiments of the present invention. The conformally coated light emitter 100 is operable to emit light 160. A portion of the light 160 may pass through the conformal coating 110. A converted portion of light 162 may result from the light conversion properties of the conformal coating 110. Some embodiments provide that a portion of the emitter generated light is reflected internally, which may result in circulating light 164. By including the conformal coating ledge 104 on the sides of the light emitter 100, an increased portion of the side emitted circulating light 164 may be converted. In this manner, additional converted light 166 may be produced, which may have a boosting effect of the overall light conversion. Further, a uniformity in combined emission characteristics may be increased at greater emission angles.

As illustrated in FIG. 15, the conformal coating 110 may include multiple optical material particles 400A through 400C having multiple different sizes, shapes, and surface features. For example, in contrast with the substantially planar surface illustrated throughout, the conformal coating may include surface textures that correspond to the optical material particles 400A through 400C. For example, by way of example, small, medium and large optical material particles, 400a, 400B and 400C, respectively are illustrated. Additionally, the surface of the conformal coating 110 may be irregular by virtue of variances in particle sizes, shapes, positions and/or surface textures.

Figure 16:
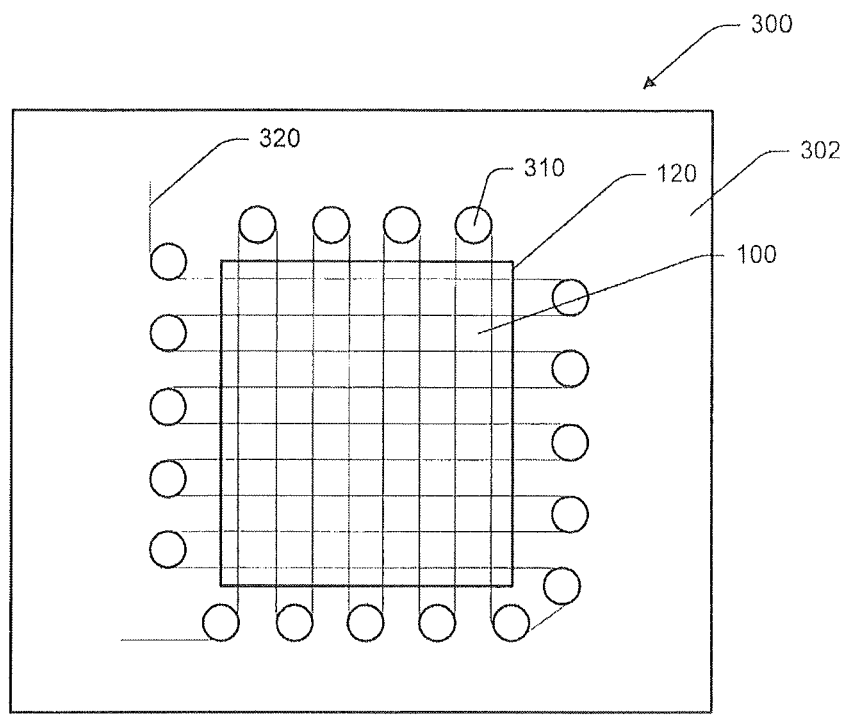
FIG. 16 is a top schematic view of a fixture for providing separation channels between conformally coated semiconductor devices according to some embodiments of the present invention.

Reference is now made to FIG. 16, which is a top schematic view of a fixture for providing separation channels between conformally coated semiconductor devices according to some embodiments of the present invention. The fixture 300 includes a substantially rigid support member 302 that includes surface that is operable to receive multiple grid alignment posts 310. The grid alignment posts 310 may be mounted to the support member 302 with spaces therebetween that correspond to a dimension of light emitters 100 conformally coated. In some embodiments, the grid alignment posts 310 may be dimensioned corresponding to a dimension of the light emitters 100. For example, if the light emitters 100 are 1.0 mm square then the grid alignment posts may have a diameter of about 1.0 mm or slightly larger.

A grid wire 320 is wound around the grid alignment posts 310 to form a grid pattern that corresponds to multiple light emitters 100 that may be on a die sheet and/or a temporary bonding surface 120. In some embodiments, the grid wire 320 may be tensioned using any number of a variety of tensioning devices (not shown), including wrapped post frictional and/or ratcheting type devices and/or spring biased attachment points, among others. Some embodiments provide that the diameter of the grid wire 320 may be 0.002", however, other sizes and/or dimensions of grid wire are contemplated herein. For example, the grid wire 320 may be smaller or larger than 0.002" and may include a circular or a non-circular cross-sectional area. The grid wire 320 may be metallic including, but not limited to alloys including gold and/or a hardened steel, among others.

The grid wires 320 may be treated and/or sprayed with a mold release agent or substance to cause local cure inhibition at the wire site. In this manner, any conformal coating that is applied to the light emitters 100 in the grid that is defined by the grid wires 320 may not cure on the grid wires 320. Once the conformal coating is applied to the light emitters 100, the fixture may be removed leaving substantially separated conformally coated light emitters 100 that may include the conformal coating ledge as described above. Some embodiments provide that the dimensions of the conformal coating ledges may be regulated by the dimensions of the grid wire 320.

Figure 17:
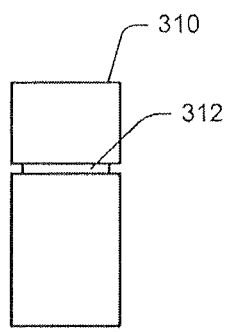
FIG. 17 is a side view of a grid alignment post as used in the fixture described in FIG. 16.

Briefly referring to FIG. 17, which is a side view of a grid alignment post 310, a groove 312 may be provided at a specific height in the grid alignment post 310 to maintain a consistent position of a grid wire 320. In this regard, the groove 312 may include a diameter that corresponds to a dimension of the light emitters 100.

Once the wire grid is removed from the light emitters 100, some embodiments provide that the bonding surface 120 may be stretched and/or deformed to cause any additional separation of the light emitters 100 that may be warranted.

Figure 18:
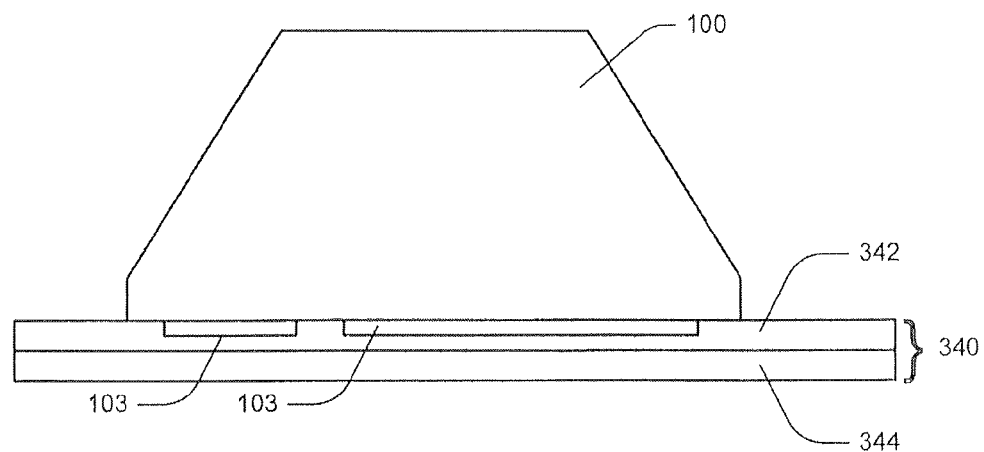
FIG. 18 is a side schematic cross-sectional view of a light emitter attached to a temporary bonding medium according to some embodiments of the present invention.

Reference is now made to FIG. 18, which is a side schematic cross-sectional view of a light emitter attached to a temporary bonding medium according to some embodiments of the present invention. As discussed above, prior to coating, a light emitter 100 may be attached to a temporary bonding media 340. The temporary bonding media 340 may include a backing portion 344 that is configured to withstand high temperatures such as at least 150° C., 175° C., and/or 20° C. For example, the backing portion may include polyimide and/or polyethylene terephthalate (PET), among others. The backing portion 344 may be a substantially rigid, deformable and/or flexible sheet and/or strip that includes a first side and a second side. An adhesive layer 342 may be provided on the first side of the backing portion 344 to retain and/or temporarily support the light emitter 100 in a specific position.

Some embodiments provide that the adhesive layer 342 includes a thickness that is sufficient to deform to, cover and/or protect any topology of the bonding surface of the light emitter 100. For example, the light emitter 100 may include one or more metal electrodes 103 on the bonding surface thereof. To prevent any of the coating material that may be subsequently applied to the light emitter 100 from contacting and thus contaminating the bonding surface and/or the metal electrodes 103, the thickness of the adhesive layer 342 may be sufficiently thick to envelop the metal electrodes 103 when the light emitter is bonded thereto.

In some embodiments, the adhesive layer may include an ultraviolet (UV) type adhesive and may be provided in a thickness including about 15 um to about 25 um, however, such thickness range is merely provided as an example. Some embodiments provide that bonding to the adhesive layer 342 may be performed at an elevated temperature and/or under increased pressure to increase the receptiveness of the adhesive layer. For example, increased temperatures and/or pressure may soften the adhesive layer 342 and/or cause the adhesive material 342 to reflow to some degree.

Figure 19:
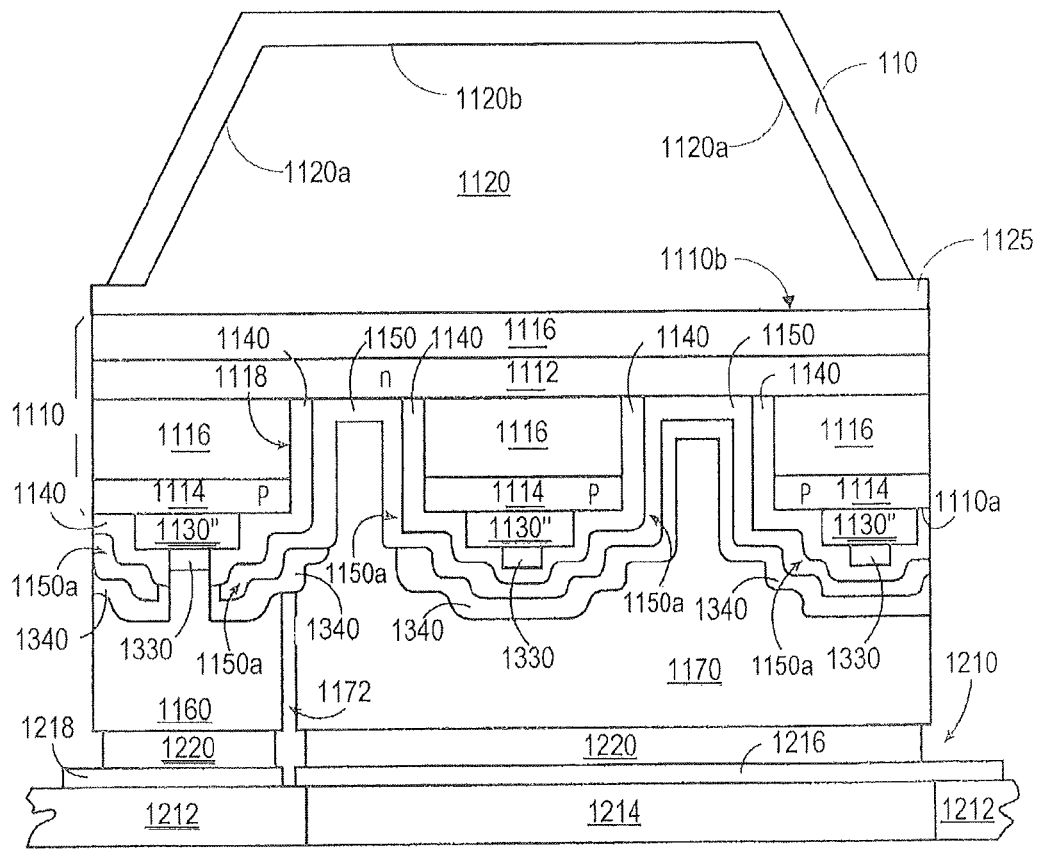
FIG. 19 is a cross-sectional view of embodiments of a conformally coated light emitting diode that employ a transparent anode contact that are mounted on a mounting substrate in a flip-chip configuration according to various embodiments.

FIG. 19 is a cross-sectional view of embodiments of a light emitting diode that employ a transparent anode contact that are mounted on a mounting substrate in a flip-chip configuration according to various embodiments. It will also be understood that any of the other embodiments described and/or illustrated herein may be mounted on a mounting substrate in a flip-chip configuration.

Referring to FIG. 19, a light emitting diode may include a diode region 1110 having first and second opposing faces 1110a, 1110b, respectively, and including therein an n-type layer 1112 and a p-type layer 1114. Other layers or regions 1116 may be provided which may include quantum wells, buffer layers, etc., that need not be described herein. The diode region 1110 also may be referred to herein as an "LED epi region", because it is typically formed epitaxially on a substrate 1120. For example, a Group III-nitride based LED epi 1110 may be formed on a silicon carbide growth substrate 1120.

An anode contact 1130, also referred to as a "p-contact", ohmically contacts the p-type layer 1114 and extends on the first face 1110a of the diode region 1110. The anode contact 1130 may extend to a greater or less extent on the p-type layer 1114 than illustrated in FIG. 19. A transparent insulating layer 1140 also extends on the first face 1110a outside the anode contact 1130. A reflective cathode contact 1150, also referred to as an "n-contact" electrically contacts the n-type layer 1112 and extends through the transparent insulating layer 1140 and onto the transparent insulating layer 1140 that is outside the anode contact 1130. In some embodiments, the reflective cathode contact 1150 may directly and ohmically contact the n-type layer 1112. In other embodiments, however, a thin ohmic contact layer, such as a layer of titanium, may provide the actual ohmic contact to the n-type layer 1112. The transparent insulating layer 1140 and the reflective cathode contact 1150 can provide a hybrid reflective structure or "hybrid mirror", wherein the underlying transparent insulating layer 1140 provides an index refraction mismatch or index step to enhance the total internal reflection (TIR) from the reflective layer 1150 compared to absence of the underlying transparent insulating layer 1140. It will also be understood that, in other embodiments, the transparent insulating layer 1140 may comprise multiple sublayers, such as oxide and nitride sublayers to provide, for example, a distributed Bragg reflector. Moreover, the reflective cathode contact 1150 may also include a plurality of sublayers.

As also shown in FIG. 19, in some embodiments, a via 1118 extends into the first face 1110a to expose the n-type layer 1112, and the transparent insulating layer 1140 extends into the via 1118. Moreover, the reflective cathode contact 1150 also extends on the transparent insulating layer 1140 into the via 1118, to electrically, and in some embodiments ohmically, contact the n-type layer 1112 that is exposed in the via 1118.

An anode pad 1160 also is provided that is electrically connected to the anode contact 1130. A cathode pad 1170 is also provided that is electrically connected to the reflective cathode contact 1150. As shown, the anode and contact pads 1160 and 1170 extend on the first face 1110a in closely spaced apart relation to one another, to define a gap 1172 therebetween. Some embodiments provide that the gap 1172 may be filled with an insulator. In any embodiments illustrated herein, the gap 1172 may occur at any desired position and is not limited to the position illustrated herein. In some embodiments, the cathode pad 1170 may be made as large as possible, so that it can be directly coupled to a grounded heat sink for enhanced thermal dissipation in a flip-chip mounting configuration, without the need for an intervening electrically insulating layer that could reduce thermal efficiency.

A transparent substrate, such as a transparent silicon carbide, growth substrate 1120, may be included on the second face 1110b of the diode region 1110. The transparent substrate 1120 may include beveled sidewalls 1120a and may also include an outer face 1120b that is remote from the diode region 1110. Some embodiments provide that the outer face 1120b may be textured. The thickness of the substrate 1120, the resistivity of the substrate, geometry of the sidewalls 1120a and/or the texturing of the outer face 1120b may be configured to enhance the far field emission of radiation from the diode region 1110 through the substrate 1120. The emission from the diode region 1110 may take place directly from the diode region 1110 through the substrate 1120 and may also take place by reflection from the reflective cathode contact 1150 back through the diode region 1110 and through the substrate 1120. In some embodiments, reflection may also take place from the anode contact 1130, as will be described in detail below.

In some embodiments, when the transparent substrate 1120 is sapphire, Patterned Sapphire Substrate (PSS) technology may be used to texture the interface between the sapphire substrate 1120 and the diode region 1110, as shown by the jagged interface between the substrate 1120 and the second face 1110b of the diode region 1110. As is well known, PSS technology may provide texture features that may be, for example, about 3 um in size on an about 5 um pitch. The use of PSS technology can enhance the extraction efficiency between the gallium nitride-based diode region 1110 and the index mismatched sapphire substrate 1120.

Accordingly, some embodiments of the invention can provide an LED that is suitable for flip-chip mounting, wherein the anode pad 1160 and the cathode pad 1170 are mounted on a supporting substrate, such as a printed circuit board or other wiring board, and emission of light takes place through the substrate 1120 remote from the anode pad 1160 and the cathode pad 1170. Thus, a lateral LED may be provided wherein both the anode contact 1130 and the cathode contact 1150 extend on a given face of the diode region (i.e., the first face 1110a), and emission takes place remote from the anode and cathode contacts 1130 and 1150, respectively, through the second face 1110b of the diode region, and through the substrate 1120. In other embodiments, the substrate 1120 may be removed so that emission takes place directly from the second face 1110b of the diode region 1110.

Some embodiments provide that the geometry of the substrate 1120 may be configured to provide a desired far field emission pattern, such as Lambertian emission. Moreover, texturing may take place on the sidewalls 1120a and/or on the outer face 1120b of the substrate 1120. Many different configurations of texturing may be used including random texturing, microlenses, microarrays, scattering regions and/or other optical regions. Different texturing on the outer face 1120b of the substrate can provide an orientation indicator that can allow pick-and-place equipment to correctly orient the LED for packaging, even if the structure of the LED is not "visible" to the pick-and-place equipment through the textured substrate.

In particular, referring to FIG. 19, the anode contact is a transparent anode contact 1130" that ohmically contacts the p-type layer 1114 and extends on the first face 1110a. It will be understood that the transparent anode contact 1130" may extend to a greater or lesser extent than illustrated. In some embodiments, the transparent ohmic contact for the p-type Group III-nitride layer 1114 may be a transparent conductive oxide, such as indium tin oxide (ITO) and, in some embodiments, may be about 2500 Å thick. The ITO may be at least 90% transparent in the wavelengths of interest. It will be understood that the ITO may include other materials therein, such as nickel or aluminum. A current spreading layer 1330, also referred to as "current spreading fingers", may be provided on a portion of the transparent anode contact 1130". The current spreading layer 1330 may comprise, for example, a sublayer of platinum (Pt) about 500 .ANG. thick, a sublayer of titanium (Ti) about 500 .ANG. thick and a sublayer of gold (Au) about 0.5 um thick, to provide a "Pt/Ti/Au" current spreading layer 1330.

In embodiments of FIG. 19, the transparent insulating layer 1140 extends onto the transparent anode contact 1130" and the reflective cathode contact 1150 also extends onto the transparent insulating layer 1140 that is on the transparent anode contact 1130" as shown by 1150a. In some embodiments, as also shown in FIG. 19, the transparent insulating layer 1140 extends onto the transparent anode contact 1130" that is outside the portion on which the current spreading layer 1330 is provided, and the reflective cathode contact 1150 also extends onto the transparent insulating layer 1140 that is on the transparent anode contact 1130" outside this portion. Thus, an integrated n-contact hybrid mirror is provided that reflects light that passes through the transparent anode contact 1130" back into the diode region 1110. It will also be understood that in embodiments of FIG. 19, the reflective cathode contact 1150 may makes direct ohmic contact with the n-type layer 1112.

Accordingly, embodiments of FIG. 19 can provide a reflective structure that comprises a reflective surface of the cathode contact 1150 that ohmically contacts the n-type layer 1112 and a reflective surface of an extension 1150a of the cathode contact 1150 that extends onto the transparent anode contact 1130", in combination with the transparent insulating layer 1140. From a total internal reflection standpoint, since the transparent anode contact 1130" also has a lower index of refraction than the diode region (index of refraction of about 1.94 for ITO), the index mismatch enhances TIR based on Snell's law. The transparent insulating layer 1140 that is on the transparent anode contact 1130" can further enhance TIR by providing an even lower index of refraction of about 1.5.

Thus, from the standpoint of reflection from the diode region 1110, only the current spreading layer 1330 may absorb light. Since the current spreading layer is a small portion of the surface area of the first face, embodiments of FIG. 19 may also provide a reflective structure that reflects light that emerges from at least 90% of the area of the first face, and in some embodiments, from at least 93% of the area of the first face. In other words, at least 90% of the diode face is covered by mirror. Moreover, the mirror may have at least 90% efficiency. It will also be understood that the current spreading layer 1330 on the transparent anode contact 1130" may be less absorbing than the current spreading layer 1330 alone. In particular, due to the index of refraction change at the ITO/GaN interface, the current spreading layer 1330 may be less absorbing on an angle average basis than the current spreading layer 1330 alone. This provides an additional benefit to using ITO as the N—GaN contact so that a metallic layer is not directly on the semiconductor.

The potentially negative impact of the current spreading layer may also be reduced by reducing the light hitting the metal current spreading layer by quenching the p-GaN under the current spreading layer 1330 so that the light hitting that area mostly comes from an angle that is outside the region directly under the current spreading layer 1330. Thus, some embodiments can also incorporate a reduced conductivity region in a p-type layer that are congruent with nearby more opaque features, such as the current spreading layer, as described in U.S. Patent Application Publication No. 2008/0217635, the disclosure of which is hereby incorporated by reference in its entirety as if set forth fully herein.

Still referring to FIG. 19, an insulating layer 1340, such as a second layer of silicon dioxide about 0.5 um thick, may be provided on the reflective cathode contact 1150. An anode pad 1160 and a cathode pad 1170 may be provided to electrically connect to the current spreading layer 1330 and the reflective cathode contact 1150, respectively. In embodiments of FIG. 19, the insulating layer 1340 may prevent the anode and cathode contact pads 1160 and 1170 from short circuiting one another. In other embodiments, however, the anode 1160 and cathode 1170 pads may be formed directly on the current spreading layer 1330 and directly on the reflective cathode contact 1150, and may be spaced apart so as to provide a gap 1172 therebetween. Many other configurations of anode pads 1160 and cathode pads 1170 may be provided in other embodiments.

Referring still to FIG. 19, a mounting substrate 1210, such as an insulating mounting substrate comprising, for example, aluminum nitride (AlN), may be used to mount the LED as described above thereon in a flip-chip configuration, such that the anode and cathode contacts 1160 and 1170 are adjacent the mounting substrate 1210 and the diode region 1110 is remote from the mounting substrate 1210. Conductive traces 1216 and 1218 may be used to provide external connections for the diode. The conductive traces 1216, 1218 may be electrically and thermally connected to the contacts 1160, 1170 using solder or other die attach material 1220. Moreover, the area occupied by the cathode contact 1170 may be enlarged, and in some embodiments maximized, whereas the area occupied by the anode contact 1160 may be reduced, and in some embodiments minimized. By providing a large area for the cathode contact 1170, the cathode contact 1170 may be directly electrically coupled to a grounded copper slug 1214 or other heat sink material, to provide enhanced thermal efficiency for the package. An intervening electrically insulating layer that could reduce thermal efficiency is not needed.

In flip-chip mounting an LED, the provision of a reflective structure, such as the reflective cathode contact 1150 that covers substantially the entire first face of the diode, and is configured to reflect substantially all light that emerges from the first face back into the first face, may be beneficial. In particular, in a flip-chip configuration, light that is not reflected back towards the first face may be substantially lost, because the mounting substrate 1210 may be substantially absorbing. Accordingly, to enhance and/or maximize light emission through the substrate 1120 in a flip-chip configuration, it may be desirable to increase or maximize the area of the first face that is covered by the mirror using various embodiments described herein.

Some embodiments provide that the substrate 1120 may include an edge portion 1125 extending from a lower portion of the substrate 1120. For example, the edge portion 1125 may be formed as an annular lip and/or ledge that extends beyond and/or from the beveled sidewalls 1120a. In some embodiments, the edge portion 1125 may be a result of a separating operation corresponding to a plurality of LEDS that are batch processed.

In some embodiments, a conformal coating 110 as discussed herein may be provided on the sidewalls 1120a and the outer face 1120b. The conformal coating 110 is applied to form a coating over the LED and may include, for example, optical materials that are operable to modify and/or convert light emitted from the LED. The conformal coating 110 may be applied to a large number of LEDs in a batch operation using, contact coating and/or spraying methods, among others.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A light emitting structure, comprising:
    a semiconductor light emitting diode (LED) comprising an active region; and
    a conformal phosphor coating comprising a first portion and a second portion, the first portion corresponding to at least one surface of the LED and the second portion extending from the first portion to form a conformal phosphor wing arranged around an edge of the LED, wherein the conformal phosphor wing coating includes a thickness in a range of about 30 μm to about 100 μm;
    wherein the conformal phosphor coating comprises a first conformal coating that is applied to the LED and a second conformal coating that is applied to the first conformal coating.

2. The light emitting structure according to claim 1,
    wherein the LED includes a first surface, at least one side surface, and a second surface that is substantially opposite the first surface, and
    wherein the conformal phosphor wing includes at least one surface that is substantially parallel to the second surface.

3. The light emitting structure according to claim 1, wherein the LED comprises a transitional surface that defines a transition between the first surface and the at least one side surface.

4. The light emitting structure of claim 1,
    wherein the first and second conformal coatings each comprise light conversion particles that are configured to convert a portion of light received from the LED.

5. The light emitting structure according to claim 1,
    wherein the first conformal coating comprises first light conversion particles having first light conversion properties, and
    wherein the second conformal coating comprises second light conversion particles having second light conversion properties that are different from the first light conversion properties.

6. A light emitting structure, comprising:
    a semiconductor light emitting diode (LED) comprising an active region; and
    a conformal coating comprising a first portion and a second portion, the first portion corresponding to at least one surface of the LED and the second portion extending from the first portion to form a conformal coating ledge, wherein the second portion of the conformal coating includes a thickness in a range of about 30 μm to about 100 μm;
    wherein the LED comprises a conductive portion on a first surface of the LED.

7. The light emitting structure according to claim 6, wherein the conformal coating ledge is substantially circumferential around the LED.

8. The light emitting structure according to claim 6,
    wherein the LED includes at least one side surface, and a second surface that is substantially opposite the first surface,
    wherein the conformal coating includes a first side and a second side that is opposite the first side;
    wherein the first side of the first portion of the conformal coating is adjacent the first surface and the at least one side surface.

9. The light emitting structure according to claim 8, wherein the first side corresponding to the second portion of the conformal coating is substantially parallel to the second surface of the LED.

10. The light emitting structure according to claim 8,
    wherein the conductive portion is free of the conformal coating.

11. The light emitting structure according to claim 10, wherein the conductive portion comprises at least one of a solder bump bond and a wirebond conductor.

12. The light emitting structure according to claim 8, wherein the LED comprises a transitional surface that defines a transition between the first surface and the at least one side surface.

13. The light emitting structure according to claim 6,
    wherein the LED is one of a plurality of LEDs, and
    wherein the second portion of the conformal coating corresponds to conformal coating that was formed in at least one gap between adjacent conformally coated ones of the plurality of LEDs.

14. The light emitting structure according to claim 6,
wherein the conformal coating comprises a first conformal coating that is applied to the LED and a second conformal coating that is applied to the first conformal coating, and
wherein the first and second conformal coatings each comprise light conversion particles that are configured to convert a portion of light received from the LED.

15. The light emitting structure according to claim 6,
wherein the conformal coating comprises a first conformal coating that is applied to the LED and a second conformal coating that is applied to the first conformal coating,
wherein the first conformal coating comprises first light conversion particles having first light conversion properties, and
wherein the second conformal coating comprises second light conversion particles having second light conversion properties that are different from the first light conversion properties.

16. A light emitting structure, comprising:
a semiconductor light emitting diode (LED) comprising:
an active region including an n-type layer and a p-type layer;
a light emitting surface;
a bonding surface that is opposite the light emitting surface; and
an n-type pad and a p-type pad that are configured to be bonded to a bonding surface of a package that provides electrical connection to the n-type layer via the n-type pad and the p-type layer via the p-type pad; and
a conformal phosphor coating on at least the light emitting surface,
wherein the conformal phosphor coating includes a phosphor coating ledge extending from around an edge of the LED;
wherein the conformal phosphor coating comprises a first conformal coating that is applied to the LED and a second conformal coating that is applied to the first conformal coating.

17. The light emitting structure according to claim 16, wherein the n-type pad and the p-type pad are coplanar with the bonding surface.

18. The light emitting structure according to claim 16, wherein the LED is wirebond free.

19. The light emitting structure according to claim 16, LED comprises a plurality of LEDS that each include the conformal phosphor coating.

20. The light emitting structure according to claim 16, wherein the LED is vertically oriented and wherein the p-type layer is below the n-type layer.

21. The light emitting structure according to claim 16, wherein the phosphor coating ledge includes at least one surface that is substantially parallel to the bonding surface of the LED.

22. The light emitting structure according to claim 16, wherein the phosphor coating ledge includes a thickness of less than or equal to about 100 µm.

23. The light emitting structure according to claim 16, wherein the LED comprises a side surface and a transitional surface that defines a transition between the light emitting surface and the at least one side surface, and
wherein the conformal phosphor coating is formed on the side surface and the transitional surface.

24. The light emitting structure according to claim 16,
wherein the first and second conformal coatings each comprise light conversion particles that are configured to convert a portion of light received from the LED.

25. The light emitting structure according to claim 16,
wherein the first conformal coating comprises first light conversion particles having first light conversion properties, and
wherein the second conformal coating comprises second light conversion particles having second light conversion properties that are different from the first light conversion properties.

26. A light emitting structure, comprising:
one or more semiconductor light emitting diodes (LEDs); and
a conformal phosphor coating comprising a first portion and a second portion, the first portion corresponding to at least one surface of each of said LEDs and the second portion extending from the first portion to form a conformal phosphor wing around an edge of each of said LEDs;
wherein said conformal phosphor wing is supported by each of said LEDs.

* * * * *